United States Patent
Cho et al.

(10) Patent No.: US 10,755,939 B2
(45) Date of Patent: Aug. 25, 2020

(54) MULTILAYER GRAPHENE USING CHEMICAL VAPOR DEPOSITION AND METHOD OF MANUFACTURING SAME

(71) Applicants: CENTER FOR ADVANCED SOFT ELECTRONICS, Pohang-si, Gyeongsangbuk-do (KR); POSTECH ACADEMY-INDUSTRY FOUNDATION, Pohang-si, Gyeongsangbuk-do (KR)

(72) Inventors: Kilwon Cho, Pohang-si (KR); Min Seok Yoo, Seosan-si (KR); Hyo Chan Lee, Pohang-si (KR)

(73) Assignees: Center for Advanced Soft Electronics, Pohang-si, Gyeongsangbuk-do (KR); Postech Academy-Industry Foundation, Pohang-si, Gyeongsangbuk-do (KR)

(*) Notice: Subject to any disclaimer, the term of this patent is extended or adjusted under 35 U.S.C. 154(b) by 0 days.

(21) Appl. No.: 16/567,262

(22) Filed: Sep. 11, 2019

(65) Prior Publication Data

US 2020/0083053 A1 Mar. 12, 2020

(30) Foreign Application Priority Data

Sep. 11, 2018 (KR) .......................... 10-2018-0108396

(51) Int. Cl.
*H01L 21/28* (2006.01)
*H01L 21/285* (2006.01)
(Continued)

(52) U.S. Cl.
CPC .... *H01L 21/28556* (2013.01); *H01L 21/0237* (2013.01); *H01L 21/02126* (2013.01);
(Continued)

(58) Field of Classification Search
CPC ......... H01L 21/28556; H01L 21/02126; H01L 21/02175; H01L 21/02205
(Continued)

(56) References Cited

U.S. PATENT DOCUMENTS

2008/0078325 A1* 4/2008 Matsuda ........... H01L 21/28562
118/723 HC
2015/0023858 A1 1/2015 Tour et al.
(Continued)

FOREIGN PATENT DOCUMENTS

EP    3 254 750 A1   12/2017
JP    2013-173660 A   9/2013

OTHER PUBLICATIONS

Chiranjeevi Maddi et al., "Nano-Architecture of nitrogen-doped graphene films synthesized from a solid CN source", Scientific Reports, Feb. 19, 2018, pp. 1-13, vol. 8, Article No. 3247.
(Continued)

*Primary Examiner* — Sheikh Maruf
(74) *Attorney, Agent, or Firm* — Rabin & Berdo, P.C.

(57) ABSTRACT

Disclosed is a method of manufacturing multilayer graphene, including (a) contacting of a metal substrate with a nonmetal element, (b) reduction through heat treatment, and (c) chemical vapor deposition of a graphene precursor on the metal substrate containing the nonmetal element dissolved therein, thereby manufacturing multilayer graphene that is doped with the nonmetal element on the metal substrate. In the multilayer graphene thus manufactured, the number of graphene layers and the work function are simultaneously adjusted by controlling the concentration of doped nonmetal element in a thickness direction of graphene through interactions related to the reduction of the nonmetal element dissolved in a copper catalyst and the growth of graphene, and moreover, the stacking structure of graphene is maintained and the optoelectronic properties of multilayer gra-
(Continued)

phene can be controlled by simultaneously regulating graphene growth and doping during the synthesis procedure without additional processing.

20 Claims, 22 Drawing Sheets

(51) Int. Cl.
*H01L 21/02* (2006.01)
*H01L 21/263* (2006.01)
*H01L 23/532* (2006.01)
*H01L 29/16* (2006.01)

(52) U.S. Cl.
CPC .. *H01L 21/02175* (2013.01); *H01L 21/02205* (2013.01); *H01L 21/2636* (2013.01); *H01L 23/53276* (2013.01); *H01L 29/1606* (2013.01)

(58) Field of Classification Search
USPC ........................................................ 438/680
See application file for complete search history.

(56) References Cited

U.S. PATENT DOCUMENTS

| | | | |
|---|---|---|---|
| 2015/0110975 A1* | 4/2015 | Matsumoto | H01L 21/28562 427/586 |
| 2015/0214048 A1 | 7/2015 | Suh et al. | |
| 2015/0303051 A1* | 10/2015 | Takeda | H01L 21/02529 438/758 |
| 2015/0371846 A1* | 12/2015 | Chan | H01L 21/02126 438/653 |
| 2016/0233085 A1* | 8/2016 | Yamaguchi | C23C 16/308 |
| 2020/0083053 A1* | 3/2020 | Cho | H01L 29/1606 |

OTHER PUBLICATIONS

Konstantin V. Emtsev et al., "Towards wafer-size graphene layers by atmospheric pressure graphitization of silicon carbide", Nature Materials, Mar. 1, 2009, pp. 203-207, vol. 8.

European Search Report dated Feb. 26, 2020.

* cited by examiner

Bernal stacking

MULTILAYER GRAPHENE USING CHEMICAL VAPOR DEPOSITION AND METHOD OF MANUFACTURING SAME

CROSS REFERENCE TO RELATED APPLICATION

The present application claims priority based on Korean Patent Application No. 10-2018-0108396, filed on Sep. 11, 2018, the entire content of which is incorporated herein for all purposes by this reference.

BACKGROUND OF THE INVENTION

1. Technical Field

The present invention relates to a method of manufacturing multilayer graphene, and more particularly to a method of manufacturing multilayer graphene in which multilayer graphene having an internal potential is synthesized through chemical vapor deposition using copper containing a nonmetal element dissolved therein as a catalyst, thus simultaneously controlling graphene growth and doping to thereby control the optoelectronic properties of multilayer graphene.

2. Description of the Related Art

Graphene is a two-dimensional carbon isotope having superior properties such as high charge mobility, high thermal conductivity and high flexibility. Multilayer graphene is able to maintain the superior properties of monolayer graphene and simultaneously has various energy band structures (electronic structures) depending on the stacking order of graphene and the number of layers thereof. Particularly, monolayer graphene has no bandgap, but multilayer graphene has a bandgap when an electric field is applied perpendicular thereto. Specifically, the energy band structure of graphene may be controlled based on a difference in electrostatic energy between layers of multilayer graphene. Thorough research is ongoing into application, to various optoelectronic devices, of multilayer graphene having the above advantages using the controllable band structure.

Due to the difficulty of performing methods of manufacturing multilayer graphene having a desired energy band structure despite the advantages of multilayer graphene, limitations are imposed on practical application thereof to optoelectronic devices. The most useful approach attempted to date to control the band structure of multilayer graphene is to use dual-gate field-effect transistors, but this approach is not suitable for application to complicated graphene-based device structures. As an alternative thereto, many attempts have been made to control the band structure through chemical doping after graphene synthesis. However, there is a problem in which the stacking structure of graphene cannot be maintained in the process of controlling the extent of doping of each layer. Moreover, in order to adjust the bandgap, Bernal-stacked graphene is being studied. The Bernal-stacked graphene has a bandgap that varies depending on an external electric field, but is problematic because multilayer graphene having a controlled graphene structure cannot be manufactured through chemical vapor deposition.

Therefore, there is the necessity for a method of manufacturing multilayer graphene, which is capable of controlling the optoelectronic properties of graphene while making it possible to synthesize multilayer graphene in which doping and thickness are controlled simultaneously during the synthesis procedure without additional processing.

SUMMARY OF THE INVENTION

Accordingly, the present invention has been made keeping in mind the problems encountered in the related art, and an objective of the present invention is to provide Bernal-stacked multilayer graphene having an internal potential, which is manufactured using copper containing a nonmetal element dissolved therein as a catalyst through chemical vapor deposition.

Another objective of the present invention is to provide multilayer graphene, in which the number of graphene layers and the work function are simultaneously adjusted by controlling the concentration of a nonmetal element, with which graphene is doped, in the thickness direction of graphene through interactions related to the reduction of the nonmetal element dissolved in a copper catalyst and the growth of graphene.

Still another objective of the present invention is to provide a method of manufacturing multilayer graphene, in which the stacking structure of graphene is maintained and the optoelectronic properties of multilayer graphene may be controlled by simultaneously regulating graphene growth and doping during the synthesis procedure without additional processing.

An aspect of the present invention provides a method of manufacturing multilayer graphene, including: (a) bringing a metal substrate into contact with a nonmetal element, thus forming the nonmetal element adsorbed to the surface of the metal substrate, the nonmetal element dissolved in the surface of the metal substrate and/or a metal compound reacted with the nonmetal element on the surface of the metal substrate; (b) heat-treating the nonmetal element adsorbed to the surface of the metal substrate, the nonmetal element dissolved in the surface of the metal substrate and/or the metal compound reacted with the nonmetal element, whereby the nonmetal element adsorbed to the surface of the metal substrate, the nonmetal element dissolved in the surface of the metal substrate and/or the nonmetal element formed by reduction of the metal compound are dissolved into the interior of the metal substrate; and (c) subjecting a graphene precursor to chemical vapor deposition on the metal substrate containing the nonmetal element dissolved therein, thereby manufacturing multilayer graphene that is doped with the nonmetal element on the metal substrate.

The multilayer graphene may be Bernal-stacked.

The number of layers of the multilayer graphene may be any one of 1 to 20.

The nonmetal element may be physically adsorbed or chemically bonded to the multilayer graphene.

The multilayer graphene may be configured such that a concentration gradient of the nonmetal element is formed in a thickness direction thereof.

The concentration gradient of the nonmetal element may be formed in a manner in which the concentration of the nonmetal element decreases the closer the multilayer graphene is to the metal substrate.

The work function and/or bandgap of the multilayer graphene may be adjusted by controlling the concentration gradient of the nonmetal element.

The nonmetal element may include at least one selected from among sulfur (S), selenium (Se), tellurium (Te), oxygen (O), boron (B), phosphorous (P), and nitrogen (N).

In step (a), the temperature and/or time required to bring the metal substrate into contact with the nonmetal element may be adjusted, thereby controlling the amount of the nonmetal element adsorbed to the surface of the metal substrate, and/or the amount of the nonmetal element dissolved in the metal substrate, of the metal compound formed on the surface of the metal substrate.

Step (a) may be performed at a temperature of 20 to 500° C. for 1 sec to 3600 sec.

The metal of the metal substrate may include at least one selected from among copper, nickel, zinc, tin, silver, gold, platinum, palladium, iron, cobalt, and alloys thereof.

The metal compound may include at least one selected from among copper sulfide, silver sulfide, gold sulfide, platinum sulfide, nickel sulfide, zinc sulfide, palladium sulfide, iron sulfide, cobalt sulfide, tin sulfide, copper selenide, silver selenide, gold selenide, platinum selenide, nickel selenide, zinc selenide, palladium selenide, iron selenide, cobalt selenide, tin selenide, copper nitride, silver nitride, zinc nitride, nickel nitride, gold nitride, platinum nitride, palladium nitride, iron nitride, cobalt nitride, tin nitride, copper phosphide, nickel phosphide, zinc phosphide, palladium phosphide, silver phosphide, gold phosphide, platinum phosphide, iron phosphide, cobalt phosphide, tin phosphide, copper telluride, silver telluride, gold telluride, platinum telluride, nickel telluride, zinc telluride, palladium telluride, iron telluride, cobalt telluride, tin telluride, copper boride, silver boride, gold boride, platinum boride, nickel boride, zinc boride, palladium boride, iron boride, cobalt boride, tin boride, and nitrides, phosphides, sulfides, selenides, tellurides and borides of metal alloys.

In step (b), the reduction of the metal compound reacted with the nonmetal element may be carried out through the heat treatment.

As such, the heat treatment may be performed at a temperature of 500 to 2,000° C.

In step (c), the nonmetal element dissolved into the interior of the metal substrate may be physically adsorbed or chemically bonded to the multilayer graphene and thus multilayer graphene, which is doped with the nonmetal element and is Bernal-stacked, may be formed.

The graphene precursor may be a hydrocarbon compound.

The hydrocarbon compound may include at least one selected from the group consisting of methane, ethane, propane, butane, ethylene, propylene, butylene, benzene, ethanol, methanol, isopropyl alcohol, 1,2,3,4-tetraphenylnaphthalene (TPN), anthracene, pyrene, naphthalene, fluoranthene, hexaphenylbenzene, tetraphenylcyclopentadienone, diphenylacetylene, phenylacetylene, triptycene, tetracene, chrysene, triphenylene, coronene, pentacene, corannulene, and ovalene.

The chemical vapor deposition may be performed at a temperature of 600 to 1,200° C.

The chemical vapor deposition may be performed through any one process selected from the group consisting of low-pressure chemical vapor deposition, atmospheric-pressure chemical vapor deposition, plasma-enhanced chemical vapor deposition, Joule-heating chemical vapor deposition, and microwave chemical vapor deposition.

Another aspect of the present invention provides multilayer graphene manufactured by the above method.

According to the present invention, Bernal-stacked multilayer graphene having an internal potential can be manufactured using copper containing sulfur dissolved therein as a catalyst through chemical vapor deposition.

Also, the present invention enables the manufacture of multilayer graphene, in which the number of graphene layers and the work function are simultaneously adjusted by controlling the concentration of sulfur, with which graphene is doped, in the thickness direction of graphene through interactions related to the reduction of sulfur dissolved in a copper catalyst and the growth of graphene.

Also, the present invention is effective in manufacturing multilayer graphene, in which the stacking structure of graphene is maintained and the optoelectronic properties of multilayer graphene can be controlled by simultaneously regulating graphene growth and doping during the synthesis procedure without additional processing.

DESCRIPTION OF SPECIFIC EMBODIMENTS

The present invention may be embodied in many different forms, and should not be construed as being limited only to the embodiments set forth herein, but should be understood to cover all modifications, equivalents or alternatives falling within the spirit and technical scope of the present invention. In the description of the present invention, detailed descriptions of related known techniques incorporated herein will be omitted when the same may make the gist of the present invention unclear.

As used herein, the terms "first", "second", etc. may be used to describe various elements, but these elements are not to be limited by these terms. These terms are only used to distinguish one element from another. For example, a first element may be termed a second element, and similarly, a second element may be termed a first element, without departing from the scope of the present invention.

Further, it will be understood that when an element is referred to as being "formed" or "stacked" on another element, it can be formed or stacked so as to be directly attached to all surfaces or one surface of the other element, or intervening elements may be present therebetween.

Unless otherwise stated, the singular expression includes a plural expression. In this application, the terms "include" or "have" are used to designate the presence of features, numbers, steps, operations, elements, parts, or combinations thereof described in the specification, and should be understood as not excluding the presence or additional possible presence of one or more different features, numbers, steps, operations, elements, parts, or combinations thereof.

The present invention pertains to a method of manufacturing multilayer graphene using chemical vapor deposition.

Figure 1A:
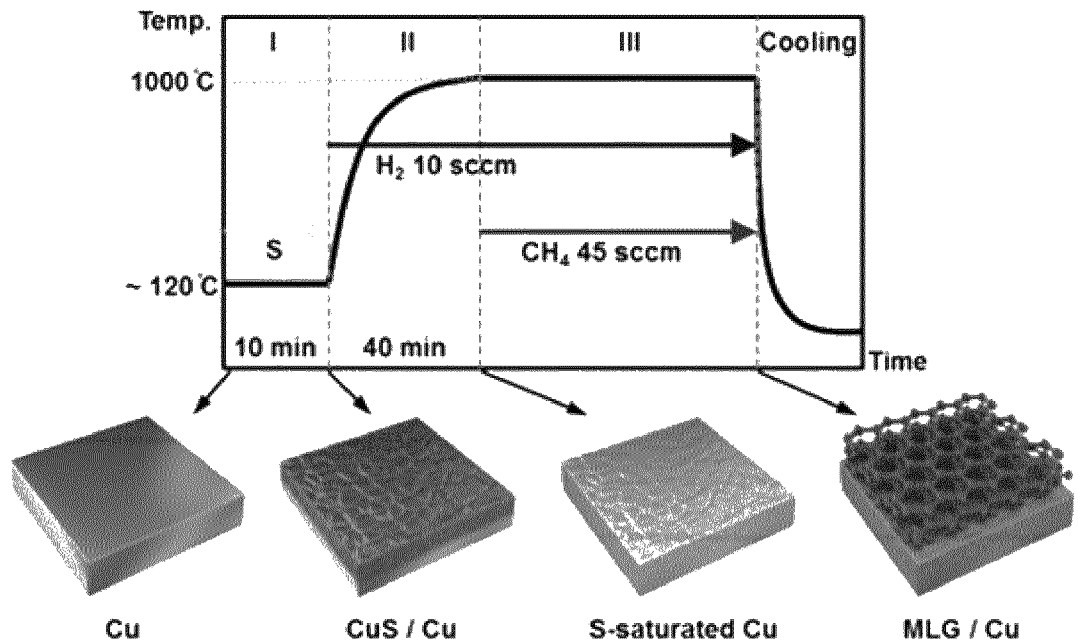
FIG. 1A schematically shows a process of manufacturing multilayer graphene of Example 1.

FIG. 1A schematically shows the process of manufacturing multilayer graphene according to the present invention.

With reference to FIG. 1A, the method of manufacturing multilayer graphene according to the present invention is described below.

Specifically, a metal substrate is brought into contact with a nonmetal element, thus forming the nonmetal element adsorbed to the surface of the metal substrate, the nonmetal element dissolved in the surface of the metal substrate and/or a metal compound reacted with the nonmetal element on the surface of the metal substrate (step a).

In step (a), the temperature and/or time required to bring the metal substrate into contact with the nonmetal element may be adjusted, thereby controlling the amount of the nonmetal element that is adsorbed to the surface of the metal substrate, and/or the amount of the nonmetal element that is dissolved in the metal substrate, of the metal compound formed on the surface of the metal substrate.

The metal substrate may be copper foil.

The nonmetal element may be provided in the form of a gas, vapor, liquid, or solid, including a nonmetal element, and is preferably a sulfur vapor.

The nonmetal element may be sulfur (S), selenium (Se), tellurium (Te), oxygen (O), boron (B), phosphorous (P), nitrogen (N), or the like, preferably sulfur (S), selenium (Se), tellurium (Te), oxygen (O) and is more preferably sulfur (S).

The metal of the metal substrate may include copper, nickel, zinc, tin, silver, gold, platinum, palladium, iron, cobalt and alloys thereof, and is preferably copper, nickel, zinc, tin, silver, gold, platinum, palladium, iron or cobalt. More preferably, copper foil including copper is used.

The metal compound is formed through reaction of the nonmetal element and the metal, and the surface of the metal substrate reacts with the gas including the nonmetal element to thus form the metal compound, whereby the metal compound is provided on the surface of the metal substrate.

The metal compound may be copper sulfide, silver sulfide, gold sulfide, platinum sulfide, nickel sulfide, zinc sulfide, palladium sulfide, iron sulfide, cobalt sulfide, tin sulfide, copper selenide, silver selenide, gold selenide, platinum selenide, nickel selenide, zinc selenide, palladium selenide, iron selenide, cobalt selenide, tin selenide, copper nitride, silver nitride, zinc nitride, nickel nitride, gold nitride, platinum nitride, palladium nitride, iron nitride, cobalt nitride, tin nitride, copper phosphide, nickel phosphide, zinc phosphide, palladium phosphide, silver phosphide, gold phosphide, platinum phosphide, iron phosphide, cobalt phosphide, tin phosphide, copper telluride, silver telluride, gold telluride, platinum telluride, nickel telluride, zinc telluride, palladium telluride, iron telluride, cobalt telluride, tin telluride, copper boride, silver boride, gold boride, platinum boride, nickel boride, zinc boride, palladium boride, iron boride, cobalt boride, tin boride, and nitrides, phosphides, sulfides, selenides, tellurides and borides of metal alloys. The type of metal compound is determined depending on the kinds of nonmetal element and metal.

The metal compound is preferably copper sulfide, copper selenide, copper telluride, copper nitride, or copper phosphide, and is more preferably copper sulfide.

Step (a) may be performed at a temperature of 20 to 500° C., preferably 20 to 150° C., and more preferably 20 to 130° C., for 1 sec to 3600 sec.

Next, the nonmetal element adsorbed to the surface of the metal substrate, the nonmetal element dissolved in the surface of the metal substrate and/or the metal compound reacted with the nonmetal element are heat-treated, whereby the nonmetal element adsorbed to the surface of the metal substrate, the nonmetal element dissolved in the surface of the metal substrate and/or the nonmetal element formed by reduction of the metal compound are dissolved into the interior of the metal substrate (step b).

In step (b), the reduction may be carried out through heat treatment. Here, heat treatment is performed at a temperature of 500 to 2,000° C., preferably 700 to 1,500° C., and more preferably 800 to 1,200° C.

The metal of the metal compound may be reduced by injecting hydrogen gas to the metal substrate having the metal compound formed thereon. Through reduction, all of the metal is reduced and simultaneously the nonmetal element dissolves into the interior of the metal substrate, thus affording the metal substrate containing the nonmetal element dissolved therein.

Finally, a graphene precursor is subjected to chemical vapor deposition on the metal substrate containing the nonmetal element dissolved therein, thereby manufacturing multilayer graphene that is doped with the nonmetal element on the metal substrate (step c).

The nonmetal element may be physically adsorbed or chemically bonded to the multilayer graphene.

The nonmetal element dissolved in the metal substrate is physically adsorbed or chemically bonded to the multilayer graphene, thereby forming multilayer graphene, which is doped with the nonmetal element and is Bernal-stacked.

The metal substrate may include the metal substrate containing the nonmetal element dissolved therein. Some of the nonmetal element dissolved in the metal substrate is adsorbed to graphene formed through chemical vapor deposition, but the remainder thereof may be left behind on the metal substrate.

The number of layers of the multilayer graphene may fall in the range of 1 to 20, preferably 1 to 15 and more preferably 2 to 15.

Figure 9:
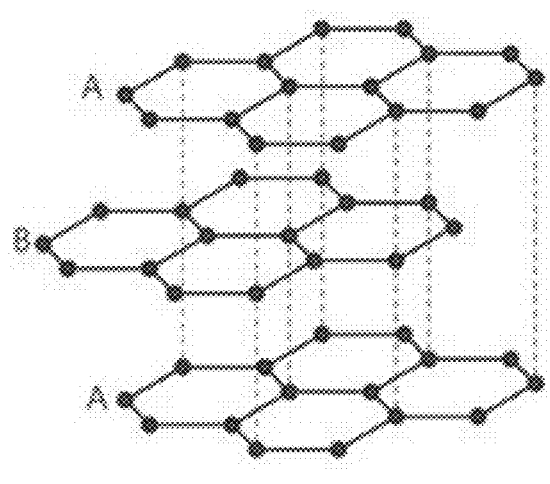
FIG. 9 schematically shows a Bernal stacking structure.

The multilayer graphene may be Bernal-stacked. With reference to FIG. 9, Bernal stacking is a stacking arrangement in which every other carbon in the hexagonal carbon ring of the upper graphene layer sits over the center of the hexagonal carbon ring of the lower graphene layer.

The multilayer graphene may be configured such that the concentration gradient of the nonmetal element may be formed in the thickness direction thereof.

Here, the thickness direction means a direction perpendicular to the metal substrate.

The concentration gradient of the nonmetal element may be formed in a manner in which the concentration of the nonmetal element decreases the closer the multilayer graphene is to the metal substrate.

The work function and/or the bandgap of the multilayer graphene may be controlled by adjusting the concentration gradient of the nonmetal element.

Since the work function of the graphene also varies in the thickness direction along the concentration gradient, an internal potential may be generated in the graphene.

The graphene layers of the multilayer graphene may be sequentially stacked in the direction toward the metal substrate. This means that, when graphene is formed through chemical vapor deposition, the graphene formed later is positioned closer to the metal substrate, and thus the last stacked or formed graphene is positioned closest to the metal substrate.

Thus, the concentration of the doped nonmetal element is decreased in the graphene that is grown later.

Figure 3A:
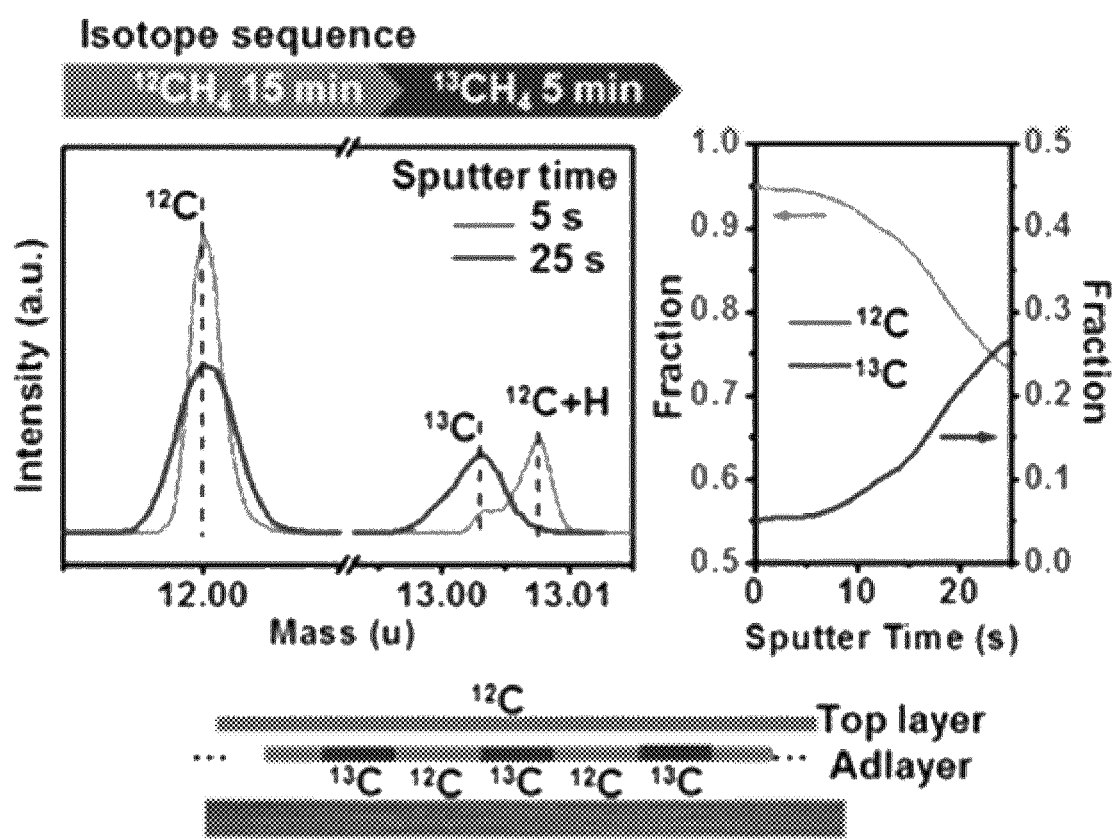
FIG. 3A shows the $^{12}C$ and $^{13}C$ mass spectra of TOF-SIMS of the multilayer graphene manufactured in Experimental Example 1 and the depth profile thereof.
Figure 3B:
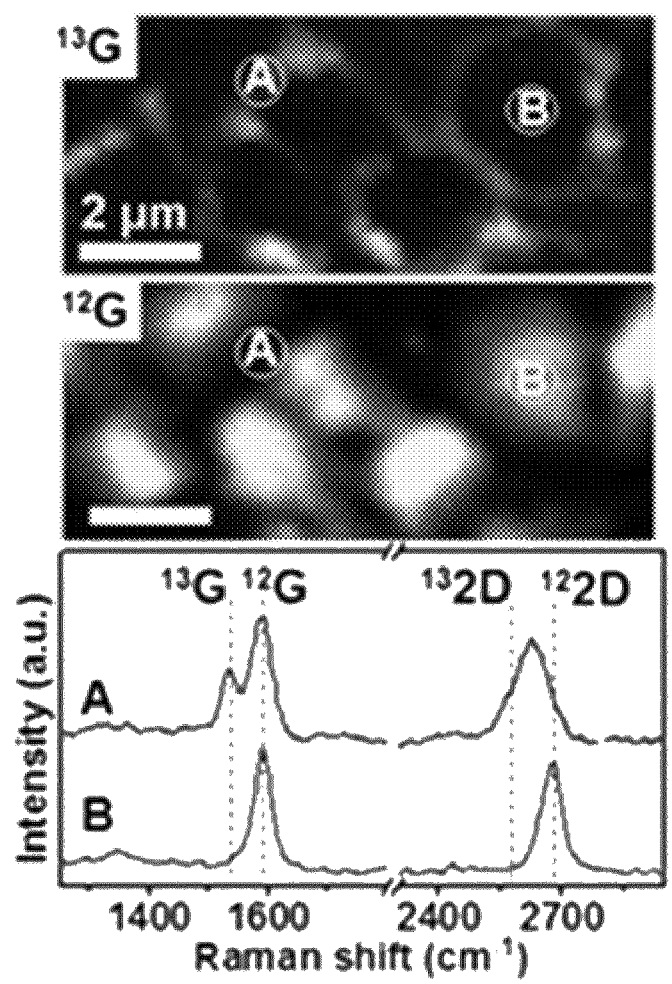
FIG. 3B shows the results of Raman spectroscopy of the multilayer graphene manufactured in Experimental Example 1.
Figure 3C:
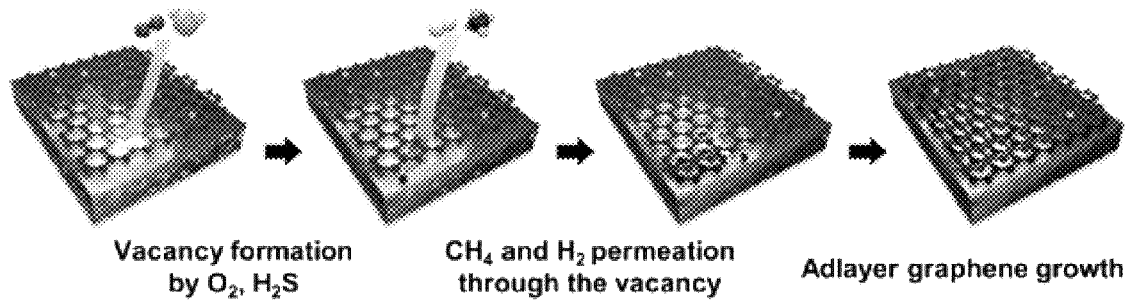
FIG. 3C schematically shows the mechanism of graphene growth and doping of graphene with sulfur in the multilayer graphene manufactured in Examples 1 and 2.

With regard thereto, FIG. 3C schematically shows the mechanism for graphene growth and doping of graphene with sulfur in the multilayer graphene manufactured in Examples 1 and 2.

In the mechanism of FIG. 3C showing the graphene growth on copper containing sulfur dissolved therein and the doping with sulfur so as to form a concentration gradient in the thickness direction of graphene, the surface CuS layer becomes thinned through the reduction reaction during hydrogen annealing at high temperatures before graphene synthesis. After 15 min, CuS completely disappears from the surface. Accordingly, the S—Cu phase is copper in which a small amount of sulfur is dissolved, and is present in the early stage of synthesis. After completion of graphene synthesis, there is almost no sulfur left in the copper. This is because sulfur dissolved in copper is slowly reduced by hydrogen, as represented in Scheme 1 below.

[Scheme 1]

$$S\ (in\ Cu) + H_2\ (g) \longrightarrow H_2S\ (g)$$

$H_2S$ generated through Scheme 1 reacts with graphene, together with a small amount of oxygen present in the chemical vapor deposition chamber, as represented in Scheme 2 below.

[Scheme 2]

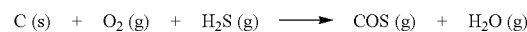

$$C\ (s) + O_2\ (g) + H_2S\ (g) \longrightarrow COS\ (g) + H_2O\ (g)$$

As shown in Scheme 2, a vacancy is formed in the graphene, methane and hydrogen permeate through the vacancy, and new graphene grows between the first grown graphene and the copper. As graphene synthesis progresses, the graphene vacancy formation rate decreases with time because the amount of sulfur dissolved in copper is decreased through the continuous reduction reaction.

Consequently, the permeation of methane and hydrogen gradually decreases and the growth rate of graphene decreases. The concentration gradient of the nonmetal element (sulfur) in the thickness direction of graphene may also be understood based on the same viewpoint. The sulfur dissolved in copper may be physically adsorbed to graphene (Graphene-S), as represented in Scheme 3 below.

[Scheme 3]

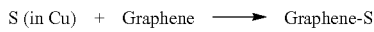

Scheme 3 also decreases because the concentration of sulfur dissolved in copper decreases with time.

This means that the extent of doping of the first grown (upper layer) graphene with sulfur is strong and the extent of doping of the graphene grown later (lower layer) becomes weak, resulting in multilayer graphene having a sulfur concentration gradient in the thickness direction.

The graphene precursor may be a hydrocarbon compound, and preferable examples thereof include methane, ethane, propane, butane, ethylene, propylene, butylene, benzene, ethanol, methanol, isopropyl alcohol, 1,2,3,4-tetraphenylnaphthalene (TPN), anthracene, pyrene, naphthalene, fluoranthene, hexaphenylbenzene, tetraphenylcyclopentadienone, diphenylacetylene, phenylacetylene, triptycene, tetracene, chrysene, triphenylene, coronene, pentacene, corannulene, and ovalene. More preferably, methane or ethane is used.

The graphene precursor may be supplied in the form of a gas.

The chemical vapor deposition may be performed at a temperature of 600 to 1,200° C., and preferably 800 to 1,050° C.

During the chemical vapor deposition, the graphene precursor may be supplied at a flow rate of 0.1 to 500 sccm, preferably 0.5 to 400 sccm, and more preferably 10 to 100 sccm.

The chemical vapor deposition may be performed for 10 to 500 min, preferably 10 to 400 min, and more preferably 10 to 300 min.

The chemical vapor deposition may be performed through any one process selected from the group consisting of low-pressure chemical vapor deposition, atmospheric-pressure chemical vapor deposition, plasma-enhanced chemical vapor deposition, Joule-heating chemical vapor deposition, and microwave chemical vapor deposition.

In addition, the present invention pertains to multilayer graphene manufactured by the above method.

The multilayer graphene, manufactured by the method of the present invention, includes a metal substrate; and multilayer graphene, which is positioned on the metal substrate, is doped with a nonmetal element, and is Bernal-stacked.

A better understanding of the present invention will be given through the following examples, which are merely set to illustrate the present invention but are not to be construed as limiting the scope of the present invention.

EXAMPLES

Example 1: Manufacture of Sulfur-Doped Multilayer Graphene (Step 1: Formation of Copper Sulfide/Copper Substrate Stack)

A metal substrate, particularly copper foil, was placed in a vacuum chamber and exposed to a sulfur vapor at a temperature of 110 to 120° C. for 15 min, thereby manufacturing a copper sulfide/copper stack in which copper sulfide (CuS) was formed on the surface of the copper foil.

(Step 2: Manufacture of Copper Substrate Containing Sulfur Dissolved Therein)

The copper sulfide/copper stack was placed in a chemical vapor deposition chamber and heated to 1000° C. in a hydrogen atmosphere of 10 sccm, whereby copper sulfide was reduced and simultaneously sulfur was dissolved into the interior of copper, thus manufacturing copper containing sulfur dissolved therein (S—Cu).

(Step 3: Growth of Graphene and Manufacture of Multilayer Graphene)

To the copper containing sulfur dissolved therein, 45 sccm of methane gas was supplied at a temperature of 1000° C. for 1 hr to thus grow graphene. After termination of graphene synthesis, the chamber was rapidly cooled, thereby manufacturing multilayer graphene (MLG/Cu), including sulfur-doped multilayer graphene on the copper foil.

The sulfur-doped multilayer graphene of the multilayer graphene was composed of 6 layers.

Example 2: Manufacture of Multilayer Graphene Including Sulfur-Doped Two-Layer Graphene Copper sulfide was synthesized at 120° C. for 5 min on the surface of copper foil, after which the copper sulfide/copper stack was then placed in a chemical vapor deposition chamber and then heated to 1000° C. in a hydrogen atmosphere of 10 sccm, thus manufacturing copper containing sulfur dissolved therein (S—Cu). Thereafter, 45 sccm of methane gas was supplied for about 20 min to thus grow graphene, and after termination of graphene synthesis, the chamber was rapidly cooled, thereby manufacturing multilayer graphene including sulfur-doped two-layer graphene.

Example 3: Manufacture of Phosphorus-Doped Multilayer Graphene (Step 1: Formation of Copper Phosphide/Copper Substrate Stack)

A metal substrate, particularly copper foil, coated with a phosphorus powder, was placed in a vacuum chamber and heated to a temperature of 300 to 500° C. for 1 hr to 12 hr, thus manufacturing a copper phosphide/copper stack in which copper phosphide was formed on the surface of the copper foil.

(Step 2: Manufacture of Copper Substrate Containing Phosphorus Dissolved Therein)

The copper phosphide/copper stack was placed in a chemical vapor deposition chamber and heated to 1000° C. in a hydrogen atmosphere of 10 sccm, whereby copper phosphide was reduced and simultaneously phosphorus was dissolved into the interior of copper, thus manufacturing copper containing phosphorus dissolved therein (P—Cu).

(Step 3: Growth of Graphene and Manufacture of Multilayer Graphene)

To the copper containing phosphorus dissolved therein, 45 sccm of methane gas was supplied at a temperature of 1000° C. for 1 hr to thus grow graphene. After termination of graphene synthesis, the chamber was rapidly cooled, thereby manufacturing multilayer graphene (MLG/Cu), including phosphorus-doped multilayer graphene on the copper foil.

The phosphorus-doped multilayer graphene of the multilayer graphene was composed of 7 layers.

Comparative Example 1: Manufacture of Multilayer Graphene Including Two-Layer Graphene not Doped with Sulfur Copper foil was exposed to sulfur at 40° C. for 5 min, placed in a chemical vapor deposition chamber and then heated to 1000° C. in an atmosphere of 10 sccm. Thereafter, 100 sccm of hydrogen and 45 sccm of methane were supplied for 20 min to thus grow graphene. After termination of graphene synthesis, the chamber was rapidly cooled, thereby manufacturing multilayer graphene including two-layer graphene not doped with sulfur.

TEST EXAMPLES

Test Example 1: Analysis of Structure of Bernal-Stacked Multilayer Graphene Formed on Copper Substrate Containing Sulfur Dissolved Therein Test Example 1-1: Analysis of TEM Image FIG. 1B shows a cross-sectional TEM image of the multilayer graphene formed on the copper foil containing sulfur dissolved therein.

Figure 1B:
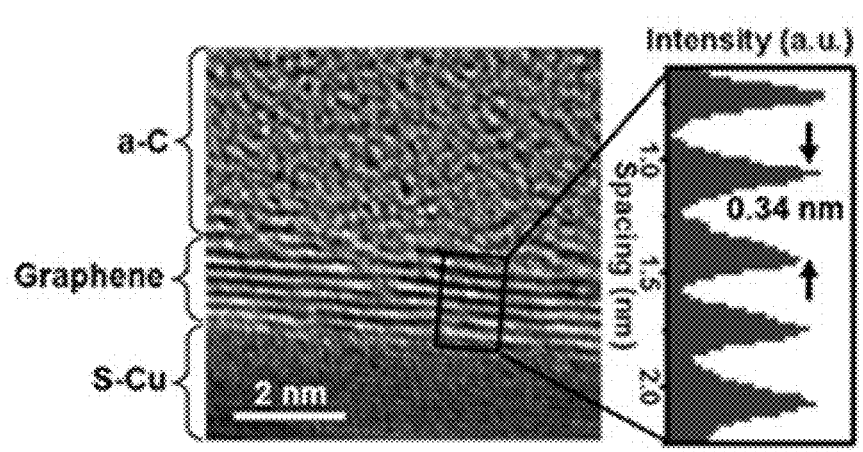
FIG. 1B is a cross-sectional transmission electron microscope (TEM) image of the multilayer graphene manufactured in Example 1.

As shown in FIG. 1B, the multilayer graphene manufactured in Example 1 was configured such that 6-layer sulfur-doped graphene (S-graphene) was grown on copper containing sulfur dissolved therein (S—Cu), which was consistent with the UV absorption results showing a transmittance of 89% at 550 nm. Furthermore, the d-spacing between the graphene layers was 0.34 nm, which was the same as the value reported for conventional graphite. All of the copper sulfide was reduced during the synthesis of graphene, indicating that copper sulfide did not appear in the copper crystals.

Based on the above results contrasted with the phenomenon of monolayer graphene growing on typical copper, it was confirmed that the growth of graphene on copper containing sulfur dissolved therein resulted in multilayer graphene.

Test Example 1-2: SAED Pattern Analysis

Figure 1C:
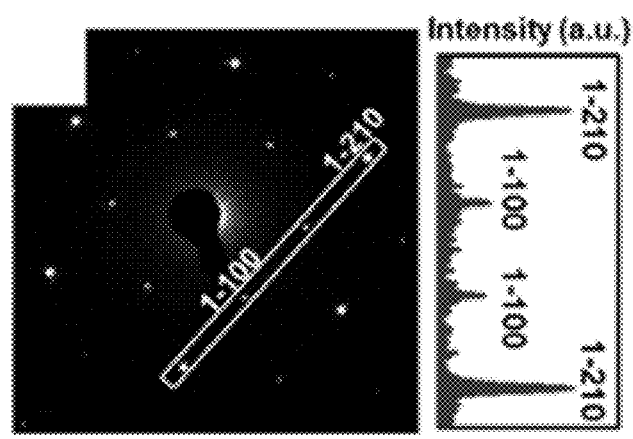
FIG. 1C shows a selective area electron diffraction (SAED) pattern image of the multilayer graphene manufactured in Example 1.

FIG. 1C shows an SAED (selective area electron diffraction) pattern image.

As shown in FIG. 1C, a hexagonal pattern appeared and there was a small misorientation of about 3° in the pattern. The point (1-210) of the pattern was stronger than (1-100), indicating that the graphene was Bernal-stacked.

Test Example 2: Analysis of Structure of Sulfur-Doped Multilayer Graphene

Test Example 2-1: Analysis of TEM and EELS Images

Figure 2A:
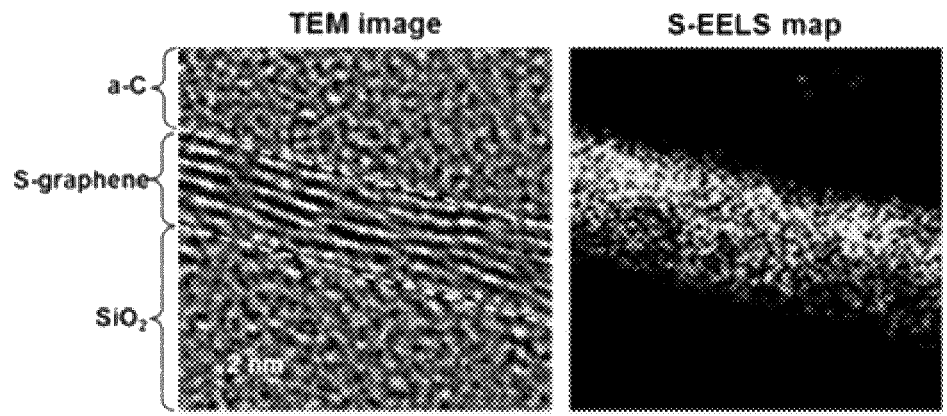
FIG. 2A shows a cross-sectional TEM image of the sulfur-doped graphene of the multilayer graphene manufactured in Example 1 and an electron energy loss spectroscope (EELS) image for a sulfur element thereof.

FIG. 2A shows a cross-sectional TEM image of the sulfur-doped graphene manufactured in Example 1 and an EELS (electron energy loss spectroscopy) image for a sulfur element thereof.

As shown in FIG. 2A, the sulfur element was detected in all graphene layers, and the upper graphene layer appeared brighter than the lower graphene layer, from which the distribution of sulfur was evaluated to be high.

Therefore, it was confirmed that sulfur was uniformly distributed over the entire area of the Bernal-stacked graphene layer and also that the closer the position of the formed graphene to the copper substrate, the lower the concentration of doped sulfur.

Test Example 2-2: Analysis of TOF-SIMS, UPS Depth Profile and Electron Density Difference Isosurface FIG. 2B shows the results of time-of-flight secondary ion mass spectroscopy (TOF-SIMS) and an ultraviolet photoelectron spectroscopy (UPS) depth profile.

Figure 2B:
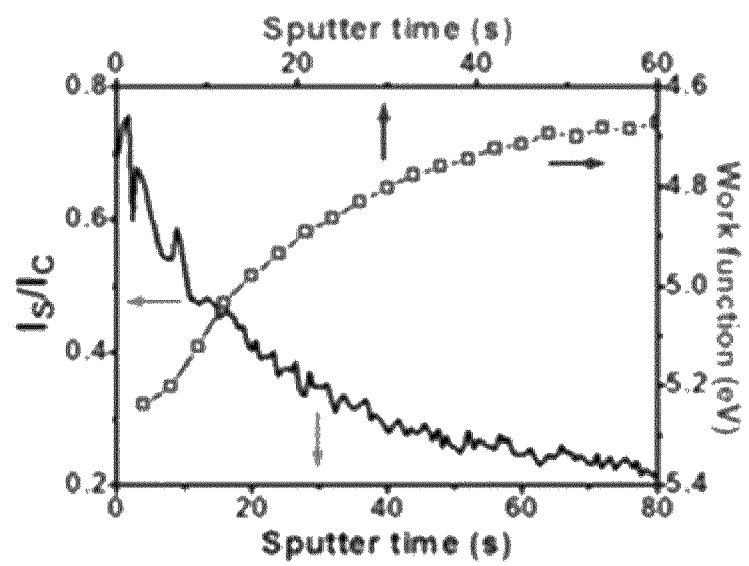
FIG. 2B shows the results of time-of-flight secondary ion mass spectroscopy (TOF-SIMS) and an ultraviolet photoelectron spectroscopy (UPS) depth profile of the sulfur-doped graphene of the multilayer graphene manufactured in Example 1.

As shown in FIG. 2B, sulfur, with which graphene was doped, had a concentration distribution in the thickness direction of graphene, and the work function gradient in the thickness direction of graphene was generated by sulfur. Based on the results of TOF-SIMS, the $I_S/I_C$ ratio of sulfur-doped graphene (S-graphene) decreased with sputtering of $Cs^+$ ions. This means that the concentration of sulfur is high in the upper graphene layer and is lowered downwards.

Since the work function of graphene varies in the thickness direction along the concentration gradient of sulfur, an internal potential may be generated in the graphene.

Figure 2C:
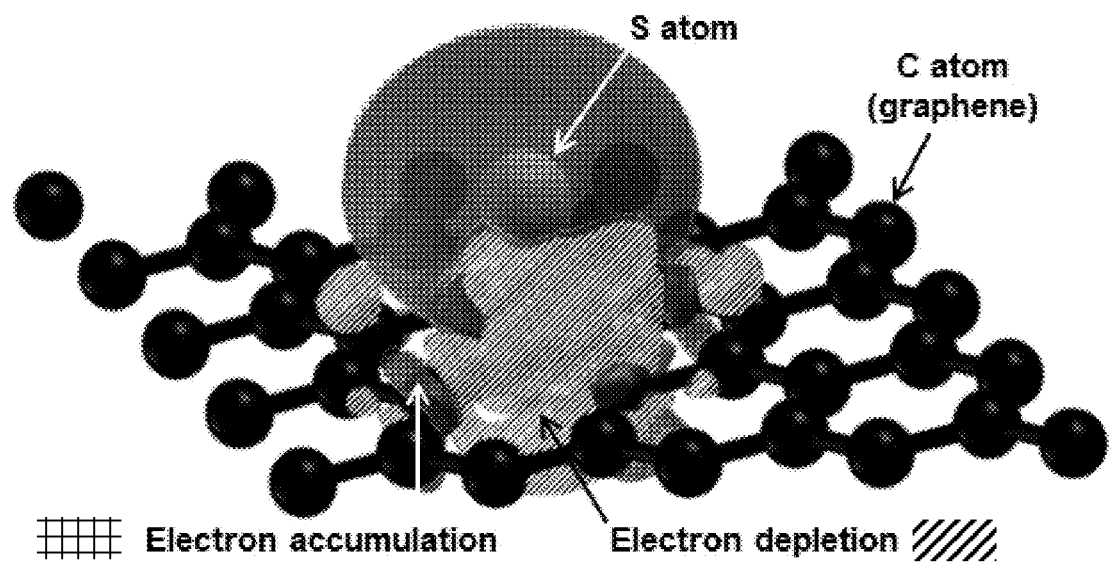
FIG. 2C shows the electron density difference isosurface of a sulfur-doped graphene system having an isolevel of 0.01 electron.bohr-3.
Figure 2D:
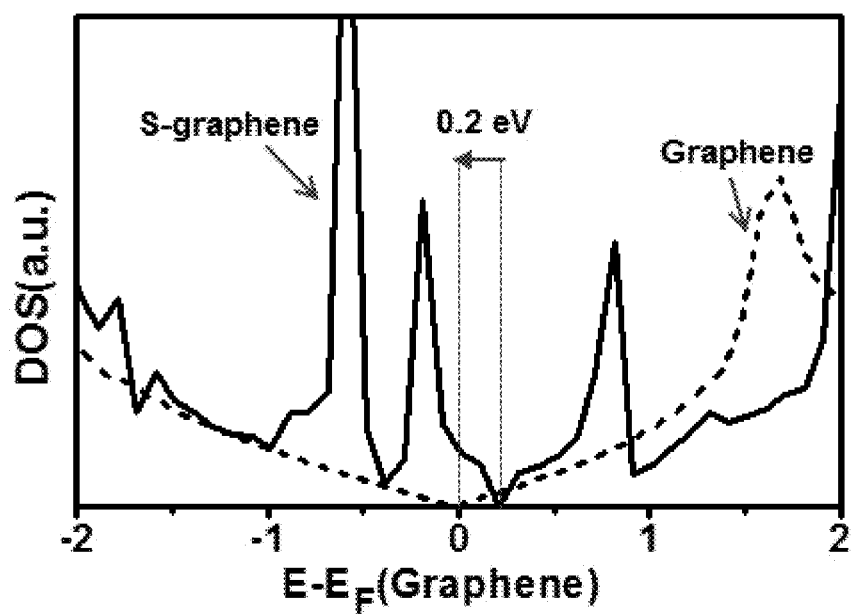
FIG. 2D is a graph showing the density of states of initial graphene and sulfur-doped graphene (S-graphene)

FIG. 2C shows the electron density difference isosurface of a sulfur-doped graphene system having a 0.01 electron-.bohr-3 isolevel, and FIG. 2D is a graph showing the density of states of initial graphene (dashed line) and sulfur-doped graphene (S-graphene) (solid line).

In order to understand changes in the work function of graphene due to sulfur, DFT calculation was performed after a sulfur atom (3 at %) was brought into contact with the carbon-carbon bridge position of graphene (32 carbon atoms) of 4×4 unit cell. The isosurface of the sulfur-doped graphene (S-graphene) obtained through calculation shows the electron density difference in the structure (diagonal line pattern: electron deficiency, square grid pattern: electron accumulation).

As shown in FIGS. 2C and 2D, based on the results of calculation, delocalized electrons present in graphene migrated toward sulfur by sulfur adsorbed to graphene, resulting in an electron deficiency in the graphene. The calculated Fermi level was 0.2 eV lower than that of pure graphene, which was consistent with the p-doping results confirmed by UPS. A strong peak (core-like) generated by the sulfur in the density of states indicated that sulfur orbitals are locally present.

Therefore, it was confirmed that the sulfur with which multilayer graphene was doped is present through physical adsorption without covalent bonding with carbon of graphene.

Test Example 3: Growth of Sulfur-Doped Multilayer Graphene on Copper Foil Containing Sulfur Dissolved Therein and Analysis of Sulfur Doping Mechanism Experimental Example 1: Manufacture of Multilayer Graphene Using Carbon Isotope In order to investigate the mechanism of growth of multilayer graphene, methane isotopes (methane gas composed of $^{12}C$ and $^{13}C$) were sequentially supplied, and thus multilayer graphene was grown.

(Step 1: Formation of Copper Sulfide/Copper Substrate Stack)

A metal substrate, particularly copper foil, was placed in a vacuum chamber and exposed to a sulfur vapor at 120° C.

for 15 min, thereby manufacturing a copper sulfide/copper stack in which copper sulfide (CuS) was formed on the surface of the copper foil.

(Step 2: Manufacture of Copper Substrate Containing Sulfur Dissolved Therein)

The copper sulfide/copper stack was placed in a chemical vapor deposition chamber and heated to 1000° C. in a hydrogen atmosphere of 10 sccm, whereby copper sulfide was reduced and simultaneously sulfur was dissolved into the interior of copper, thus manufacturing copper containing sulfur dissolved therein (S—Cu).

(Step 3: Growth of Graphene and Manufacture of Multilayer Graphene)

To the copper containing sulfur dissolved therein, 50 sccm of methane was supplied at a temperature of 1000° C. for 15 min to thus grow monolayer graphene over the entire area of copper, and isotope-labeled graphene was supplied with 50 sccm of $^{12}CH_4$ for 15 min and $^{13}CH_4$ for 5 min, thus growing graphene.

Test Example 3-1: Analysis of TOF-SIMS

FIG. 3A shows the TOF-SIMS mass spectra and depth profile analysis results.

As shown in FIG. 3A, graphene grown over the entire area from $^{12}CH_4$ supplied first constituted the upper graphene layer, and graphene grown from $^{13}CH_4$ supplied later constituted the lower graphene layer. The first grown graphene did not completely passivate the copper surface, and thus the $^{13}CH_4$ supplied later permeated into the upper graphene layer, thereby forming new graphene at the interface between the first grown graphene and the copper.

Test Example 3-2: Raman Spectroscopy

FIG. 3B shows the results of Raman spectroscopy of the multilayer graphene manufactured in Experimental Example 1.

Specifically, FIG. 3B shows the $^{12}$G-peak intensity of graphene composed of $^{12}C$ and the $^{13}$G-peak intensity of graphene composed of $^{13}C$ for the G-peak of Raman spectrum. The $^{12}$G-peak was observed over the entire area, whereas the $^{13}$G-peak was observed only in some regions.

The cross pattern indicates that the sulfur-doped graphene (S-graphene) grows in a surface diffusion and edge attachment manner, in which carbon diffuses on the surface of a catalyst and adheres to the nucleus of graphene, without the influence of carbon deposited in the cooling process.

Test Example 3-3: Analysis of Growth Mechanism of Multilayer Graphene Including Sulfur-Doped Graphene FIGS. 3D and 3E show the results of measurement of vacancy density ($N_v/N_C$) and the number of graphene layers depending on the synthesis time.

Figure 3D:
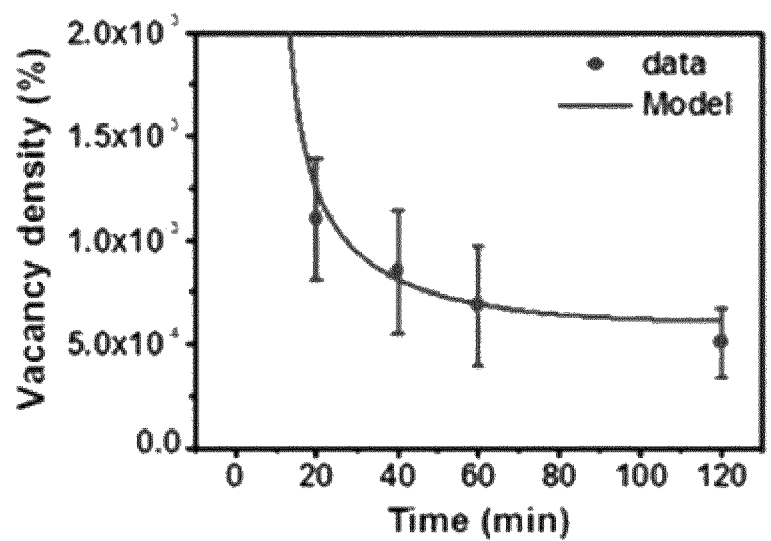
FIG. 3D shows the results of analysis of vacancy density ($N_v/N_C$) depending on the graphene synthesis time of multilayer graphene.
Figure 3E:
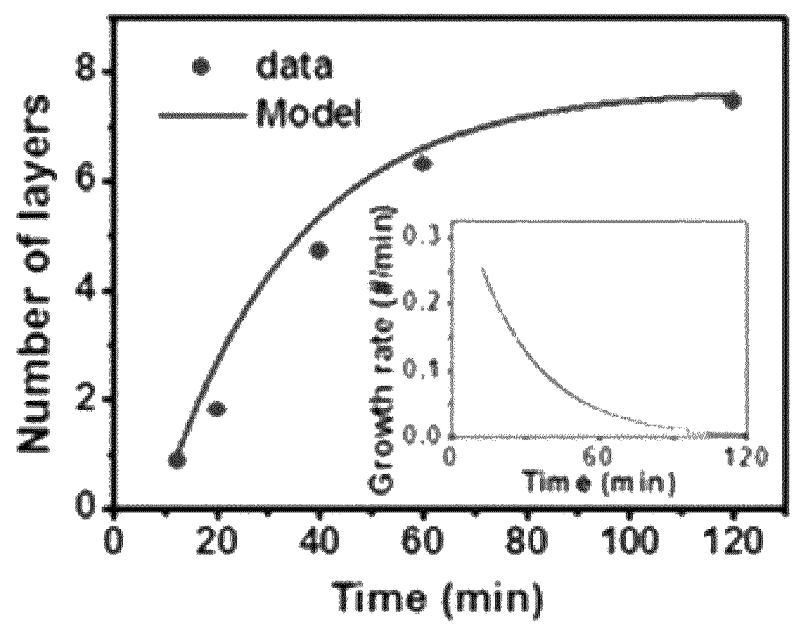
FIG. 3E shows the results of measurement of the number of graphene layers depending on the graphene synthesis time of the multilayer graphene.

As shown in FIGS. 3D and 3E, the average vacancy concentration gradually decreased with synthesis time. This tendency means that the graphene formed later (lower layer) has a lower vacancy density. Therefore, it was confirmed that the growth rate of graphene decreased with a decrease in vacancy density.

Consequently, the thickness and doping of sulfur-doped graphene (S-graphene) can be controlled through the reduction of copper containing sulfur dissolved therein (S—Cu) and the growth of graphene. That is, it is judged that the synthesis of multilayer graphene having a desired thickness and doping distribution is possible by controlling the synthesis process.

Figure 4A:
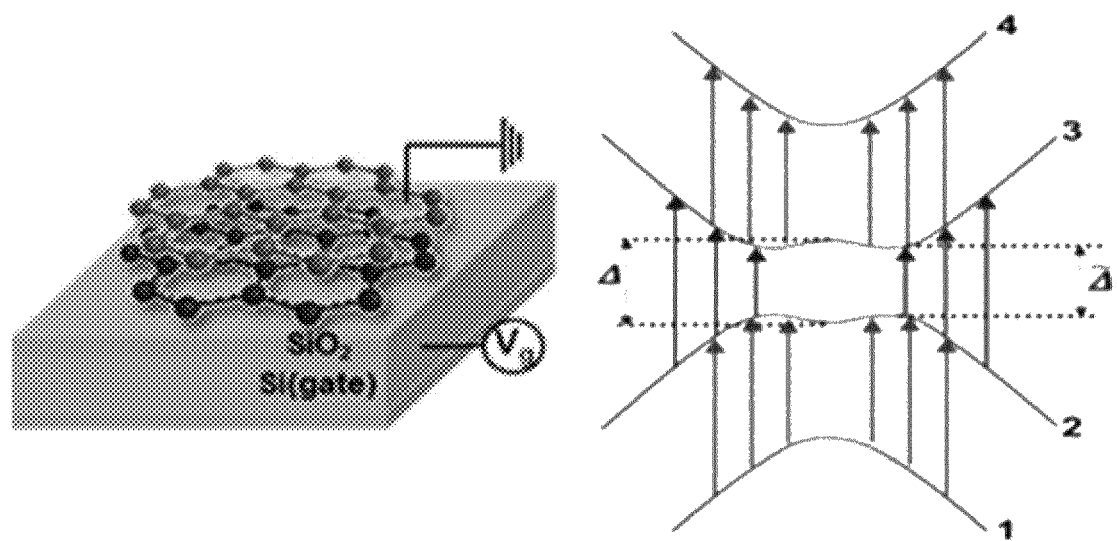
FIG. 4A shows the IR measurement device at a given gate voltage and the bandgap of Bernal-stacked graphene.
Figure 4B:
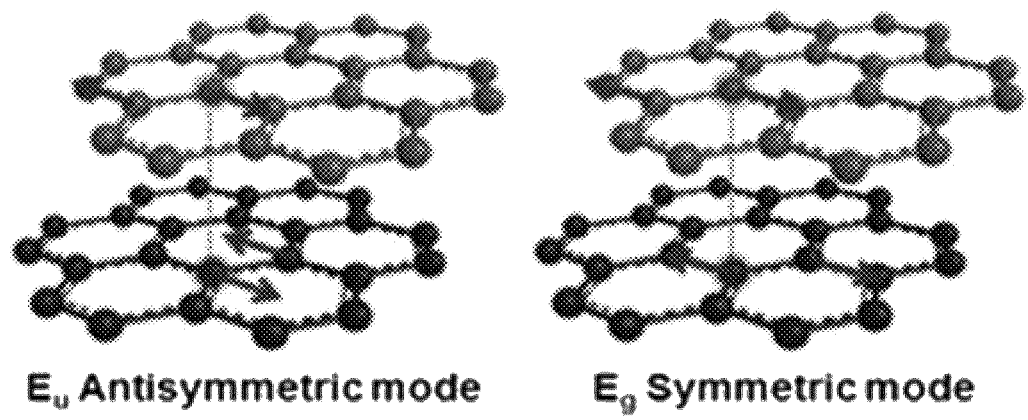
FIG. 4B shows two phonon modes of Bernal-stacked graphene (Eu, antisymmetric mode phonon and Eg, symmetric mode phonon)

Test Example 4: Characteristics of Multilayer Graphene with or without Sulfur Doping Test Example 4-1: IR Absorption Diagram and Band Structure The left of FIG. 4A shows the IR measurement device at a given gate voltage, and the right thereof shows various excitation and bandgap schemes occurring in the band structure of Bernal-stacked graphene. FIG. 4B shows two phonon modes of Bernal-stacked graphene (Eu, antisymmetric mode phonon, and Eg, symmetric mode phonon).

As shown in FIG. 4A, after transfer to the 300 nm $SiO_2$/Si/300 nm $SiO_2$ substrate, changes in electrical resistance depending on the gate voltage (gate bias) and IR spectra were measured. Here, $V_D$ (charge neutrality point or Dirac voltage) appeared at 20 V in the multilayer graphene (Sym-graphene) manufactured in Comparative Example 1 and at 70 V in the multilayer graphene (Asy-graphene) manufactured in Example 1.

Specifically, the IR absorption in the 0.19 eV region corresponding to the G-mode phonon of graphene was analyzed. As shown in FIG. 4B, in the undoped Bernal-stacked graphene, the antisymmetric mode phonon (Example 2) is IR-active but the symmetric mode phonon (Comparative Example 1) is IR-inactive due to the lack of change in dipole momentum. If Δ is present, the symmetric phonon mode becomes IR-active because the inversion symmetry of the two-layer graphene breaks. The shape of the IR absorption at 0.19 eV, which is the phonon peak, varies depending on the relative contribution of the antisymmetric mode and the symmetric mode phonon, based on the Fermi level and the bandgap of graphene, to the phonon peak.

Therefore, it was confirmed that the phonon mode, which determines IR absorption, can be determined by controlling the synthesis conditions of graphene according to the present invention.

Test Example 4-2: Analysis of IR Absorption Depending on Gate Voltage in 0.19 eV Region FIGS. 5A and 5B shows the results of IR absorption depending on the gate voltage in Comparative Example 1 (Sym-graphene) and Example 1 (Asy-graphene), respectively, and FIG. 5C is a graph showing the IR absorbance of the stacks manufactured in Example 2 and Comparative Example 1 depending on the gate voltage, as calculated using Equation 1.

Figure 5A:
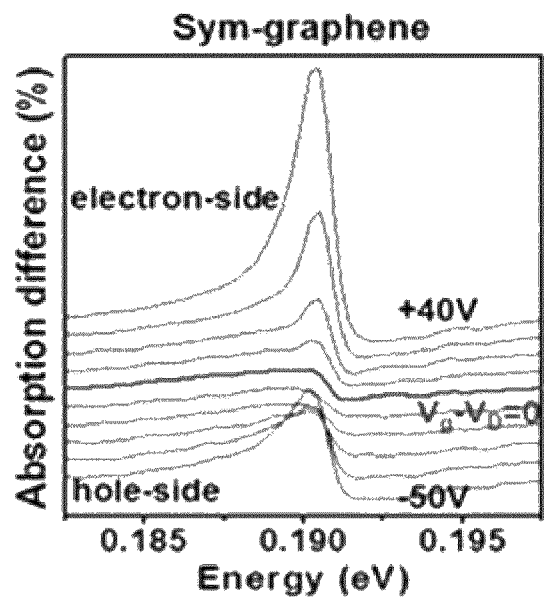
FIG. 5A shows a difference in IR absorbance of the multilayer graphene manufactured in Comparative Example 1 depending on the gate voltage.
Figure 5B:
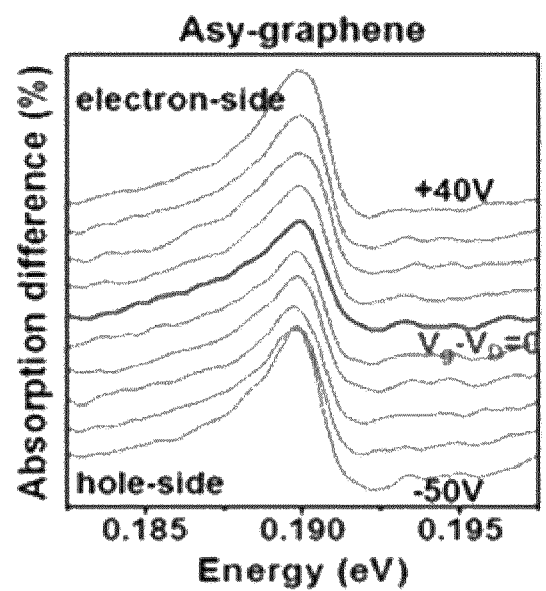
FIG. 5B shows a difference in IR absorbance of the multilayer graphene manufactured in Example 2 depending on the gate voltage.

As shown in FIGS. 5A and 5B, the IR absorption of Example 2 (Asy-graphene) depending on the gate voltage was different from changes in the absorption of Comparative Example 1 (Sym-graphene). The phonon peak was clearly observed in a wide range of $|V_g-V_D|$, and changes in intensity of the absorption peak depending on the gate voltage were small. These results indicate that the symmetric phonon mode due to Δ contributes significantly to the IR absorption for the phonon peak.

Figure 5C:
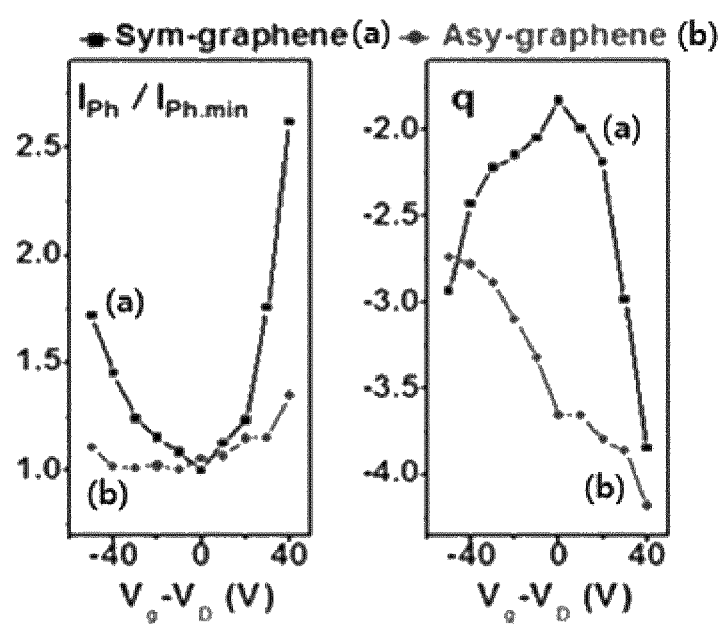
FIG. 5C is a graph showing the results of IR absorbance of the stacks manufactured in Example 2 and Comparative Example 1 depending on the gate voltage, as calculated using Equation 1.

As shown in the right of FIG. 5C, |q| is the smallest at $V_g-V_D=-50$ V and |q| increases with an increase in $V_g$. This is because A between the graphene layers becomes larger than $h\omega_0$ with an increase in $V_g$, resulting in a decreased 2→3 transition having 0.19 eV. Here, the reason why the negative phonon peak (dip shape) does not appear is that the bandgap of Asy-graphene is greater than 0.2 eV at $|V_g-V_D|$ over the whole measurement range. The IR absorption tendency of Asy-graphene was confirmed to be consistent with the doping state of Asy-graphene as above (at $V_g$=0, the upper graphene layer was more p-doped than the lower layer by 0.3 eV).

Figure 6A:
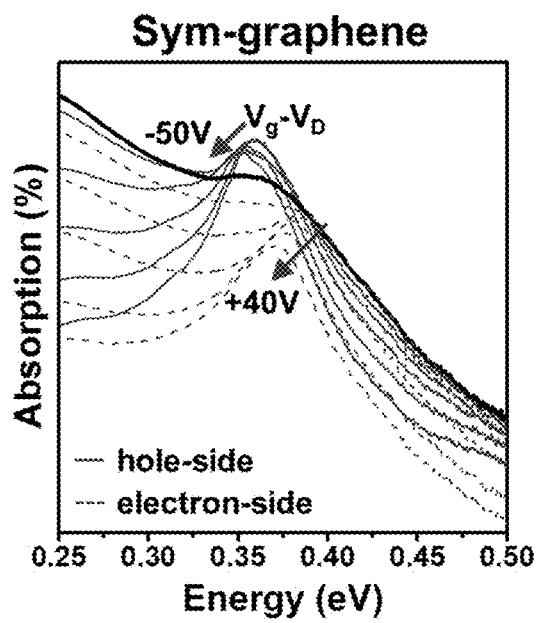
FIG. 6A is a graph showing the IR absorption spectrum of the multilayer graphene manufactured in Comparative Example 1.

Test Example 4-3: Analysis of IR Absorption Depending on Gate Voltage in 0.35 eV Region FIG. 6A is a graph showing the IR absorption spectrum of the multilayer graphene (Sym-graphene) manufactured in Comparative Example 1, FIG. 6B shows the results of analysis of IR absorbance of the multilayer graphene (Asy-graphene) manufactured in Example 2 depending on the gate voltage, and FIG. 6C shows the results of analysis of absorption peak position depending on the gate voltage.

IR absorption depending on the gate voltage was analyzed in the 0.35 eV region corresponding to 1→2 and 3→4 electronic transitions of the multilayer graphene manufactured in Example 2 and Comparative Example 1. In the undoped two-layer Bernal-stacked graphene, two conduction bands and two valence bands are parallel pairs at 0.35 eV intervals. Hence, a clear IR absorption peak appears at 0.35 eV. As shown in FIG. 6A, in Sym-graphene, as $|V_g-V_D|$ increased, the absorption peak was red-shifted (FIG. 6C), which means that the bandgap of Sym-graphene increased. When a positive voltage is applied to the Sym-graphene, more negative charges are gathered in the lower graphene layer compared to the upper graphene layer due to the screening effect of the lower graphene layer. Likewise, when a negative voltage is applied, more positive charges are gathered in the lower graphene layer compared to the upper layer. Consequently, the asymmetry of the two layers increases with an increase in $|V_g-V_D|$, resulting in a bandgap of graphene.

When asymmetry of the two layers occurs, bands 1 and 4 are almost unchanged but band 2 (high valence band) is deformed downwards and band 3 (low conduction band) is deformed upwards (the whole band is shaped like a Mexican hat). Consequently, the intervals between 1→2 and 3→4 are reduced (red shift of energy), which was consistent with actual test results.

Figure 6B:
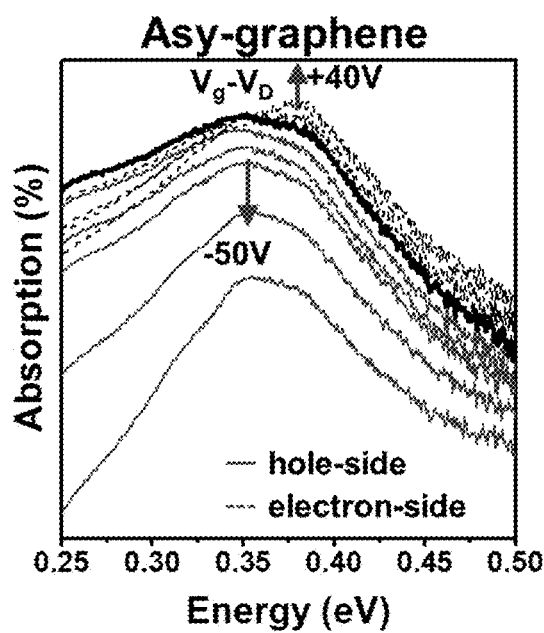
FIG. 6B shows the results of analysis of IR absorbance of the multilayer graphene manufactured in Example 2 depending on the gate voltage.
Figure 6C:
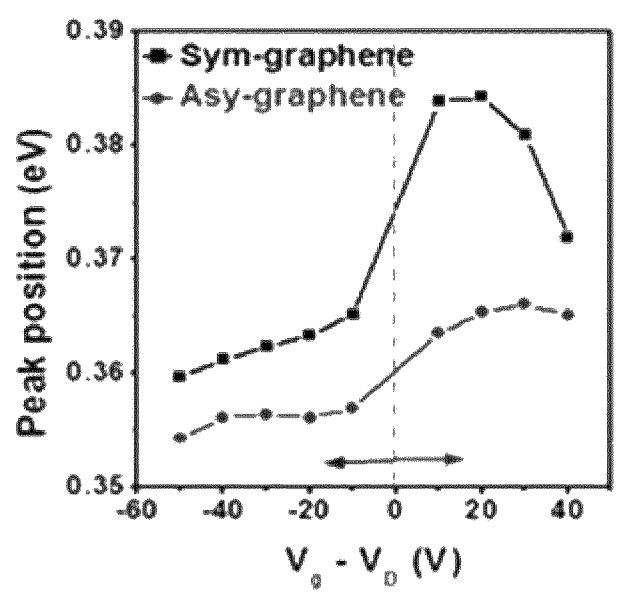
FIG. 6C shows the results of analysis of absorption peak position depending on the gate voltage.

As shown in FIG. 6B, the absorption peak of the multilayer graphene (Asy-graphene) of Example 2 at 0.35 eV was wider than that of the multilayer graphene (Sym-graphene) of Comparative Example 1. This difference is due to the fact that the conduction band/valance band pairs, which existed in parallel, were deformed by Δ, resulting in 1→2 and 3→4 transitions having various energies. The position of the absorption peak was almost constant regardless of the gate voltage, which means that the multilayer graphene (Asy-graphene) of Example 2 has a large bandgap at $V_g$=0.

Test Example 4-4: Analysis of IR Absorption of Multilayer Graphene at Charge Neutrality Point (CNP)

Figure 7A:
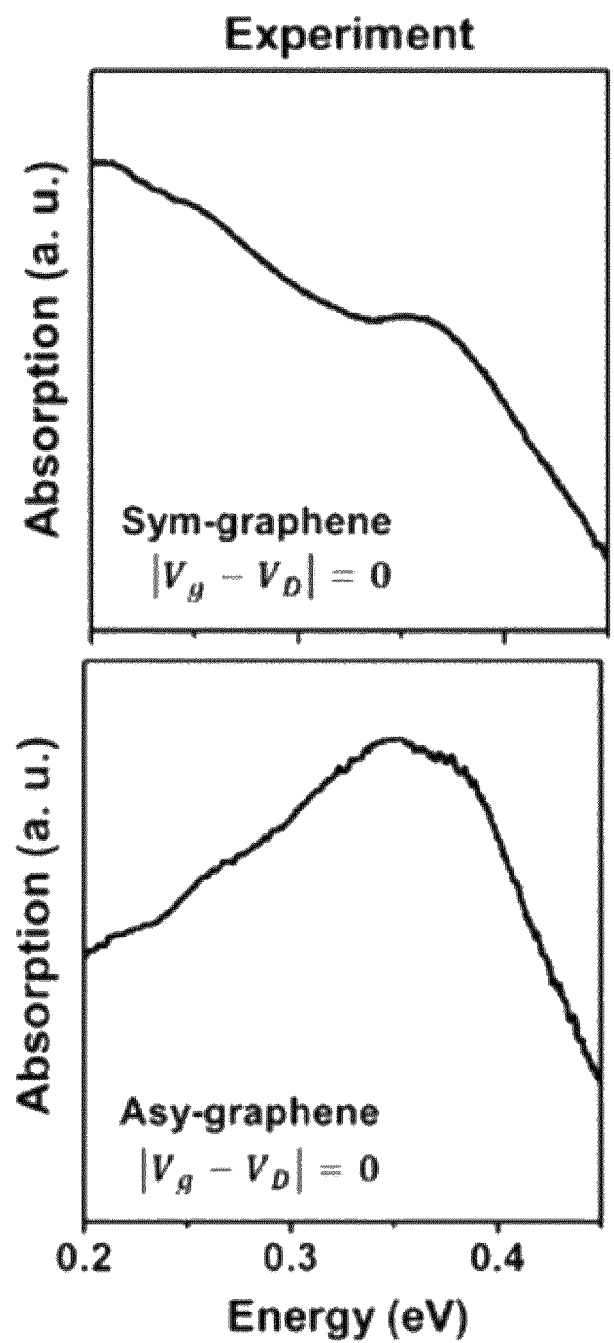
FIG. 7A shows the IR absorption spectra of the multilayer graphene (Sym-graphene) manufactured in Comparative Example 1 and the multilayer graphene (Asy-graphene) manufactured in Example 1 at a charge neutrality point (CNP)
Figure 7B:
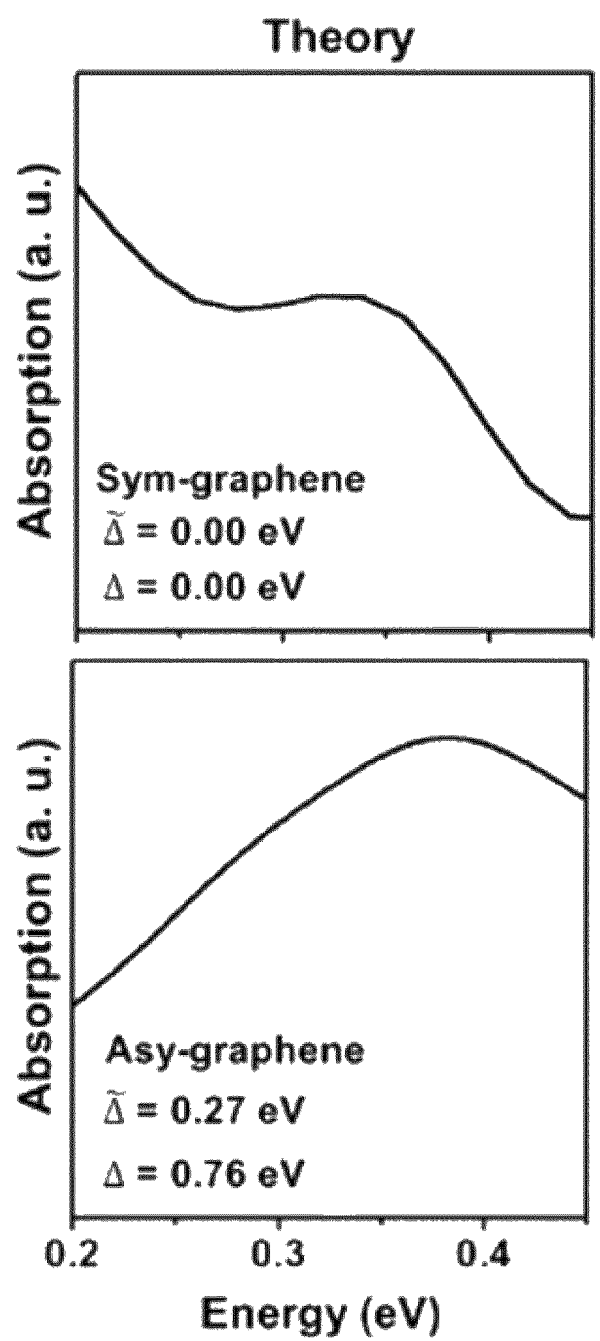
FIG. 7B shows the IR absorption spectrum depending on the bandgap of graphene through density functional theory (DFT) in the multilayer graphene (Sym-graphene) manufactured in Comparative Example 1 and the multilayer graphene (Asy-graphene) manufactured in Example 1.

FIG. 4A shows the IR measurement device at a given gate voltage and the band structure of Bernal-stacked graphene, FIG. 7A shows the IR absorption spectra of the multilayer graphene (Sym-graphene) of Comparative Example 1 and the multilayer graphene (Asy-graphene) of Example 1 at CNP (at which electrical resistance is the highest), and FIG. 7B shows the results of calculation of IR absorption spectrum depending on the bandgap of graphene through density functional theory (DFT).

As shown in FIG. 4A, CNP, at which electrical resistance is the highest, appeared at 20 V in the multilayer graphene (Sym-graphene) of Comparative Example 1 and at 70 V in the multilayer graphene (Asy-graphene) of Example 1. In the graphene at CNP, 1→2 and 3→4 electronic transitions are impossible due to Pauli blocking in the measurement range (0.2 eV to 0.45 eV), and thus the absorption spectrum is determined by the 2→3 electronic transition.

As shown in FIG. 7A, as the energy increases, the light absorption gradually decreases. This is due to the decrease in the optical joint density depending on the energy, which is consistent with the conventional results of graphene, having no bandgap. Furthermore, the same results as the DFT calculation results (the upper portion of FIG. 7B) of graphene having no bandgap were obtained. On the other hand, the wide absorption peak at 0.35 eV was observed in the multilayer graphene (Asy-graphene) of Example 1, which means that the bandgap is large at CNP. Based on the results of calculation of the multilayer graphene (Asy-graphene) graph of Example 1 of FIG. 7B, when the graphene has large Δ (>0.4 eV), it can be confirmed that the IR absorption spectrum as in the test results was obtained.

Therefore, it is concluded that the growth of graphene on a catalyst containing sulfur dissolved therein resulted in graphene having a bandgap greater than the graphene bandgap obtained through conventional dual-gate transistors or chemical doping.

Test Example 5: Characteristics of Transistor Device Including Multilayer Graphene Device Example 1: Manufacture of Dual-Gate Transistor Including Sulfur-Doped Graphene The graphene of Example 1 was transferred to a 300 nm $SiO_2$ (bottom dielectric layer)/Si substrate, an electrode (Au) was deposited thereon, and a 70 nm $Al_2O_3$ (top dielectric layer) was formed thereon through ALD (atomic layer deposition). Additionally, perylene was formed at a thickness of 15 nm thereon in order to prevent pinholes that deteriorate the function of $Al_2O_3$, and finally, a top gate electrode (Au) was deposited, thereby manufacturing a dual-gate transistor including sulfur-doped graphene.

Figure 8A:
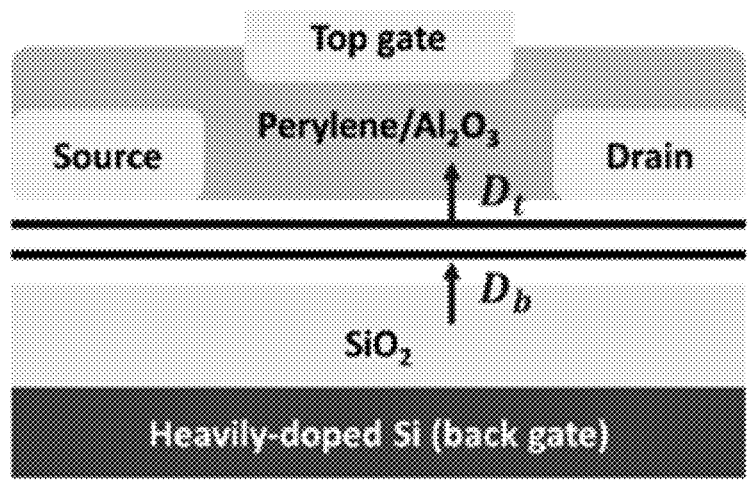
FIG. 8A shows the cross-sectional structure of a dual-gate graphene transistor device including the multilayer graphene manufactured in Example 1.

The cross-sectional structure of the dual-gate transistor including sulfur-doped graphene is shown in FIG. 8A.

Test Example 5-1: Analysis of Doping State of Sulfur-Doped Graphene (S-Graphene)

Figure 8B:
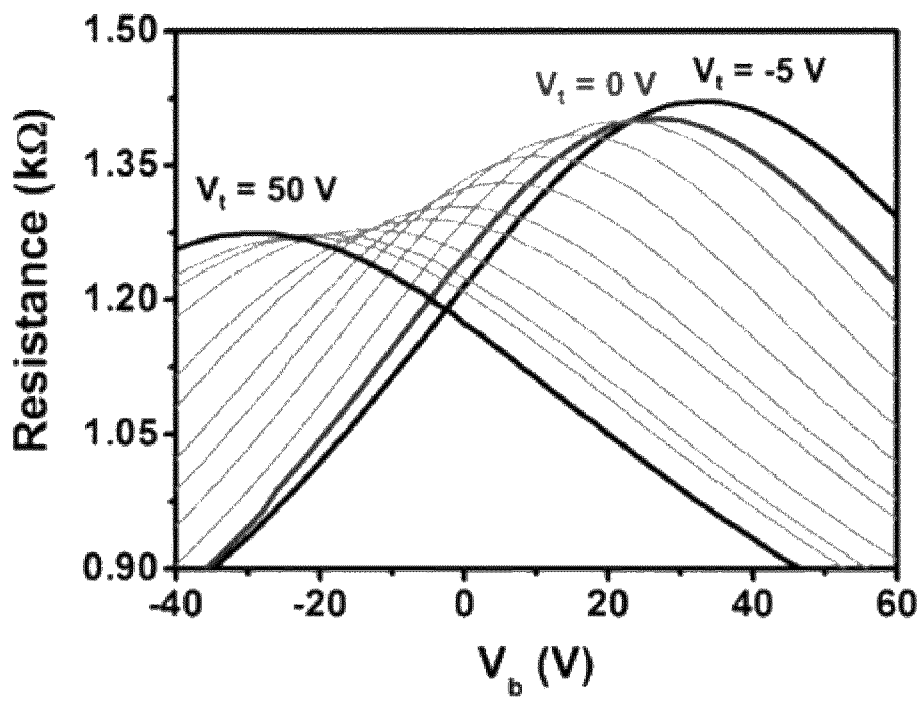
FIG. 8B shows the results of analysis of resistance depending on changes in bottom gate voltage of the dual-gate graphene transistor device including the multilayer graphene manufactured in Example 1.

FIG. 8B shows the results of measurement of changes in resistance depending on changes in bottom gate voltage at different top gate voltages of the dual-gate transistor manufactured in Device Example 1.

In the dual-gate transistor manufactured in Device Example 1, the top and bottom displacement fields ($D_t$, $D_b$) are adjusted, thereby independently controlling the net carrier density of graphene and the bandgap of graphene.

When the difference between $D_b$ and $D_t$ ($\delta D = D_b - D_t$) is not zero, the net charge density is not zero (deviating from charge neutrality point, CNP), and when the average of $D_b$ and $D_t$ ($D_{avg} = (D_b + D_t)/2$) is not zero, the on-site energy symmetry of graphene is broken and a graphene bandgap is generated. $D_b$ and $D_t$ are defined as the following Equation 1 and Equation 2, respectively.

$$D_b = \varepsilon_b(V_b - V_{b0})/d_b \quad \text{(Equation 1)}$$

$$D_t = \varepsilon_t(V_t - V_{t0})/d_t \quad \text{(Equation 2)}$$

For $SiO_2$, $\varepsilon_b = 3.9$, $d_b = 300$ nm, and for perylene/$Al_2O_3$ layer, $d_t = 90$ nm. The $\varepsilon_t$ obtained through measurement was 1.4, as calculated through the slope of FIG. 8C, and $V_0$ of the equation designates the effective offset voltage.

Figure 8C:
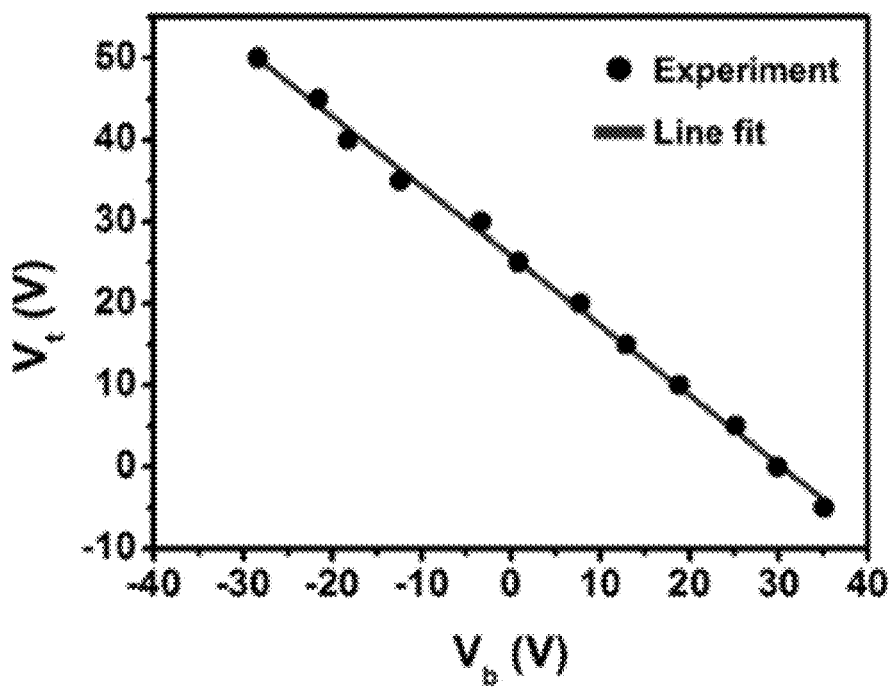
FIG. 8C is a graph showing the top and bottom gate voltages, which represent the maximum resistance of the dual-gate graphene transistor device including the multilayer graphene manufactured in Example 1.

With reference to FIGS. 8B and 8C, FIG. 8B shows the data obtained by measuring transistor resistance depending on changes in $V_b$ under the condition that $V_t$ was fixed, and $V_t$ and $V_b$, representing the maximum resistance values in the data obtained through measurement, appeared linear, as shown in FIG. 8C.

The offset voltage mentioned above can be determined under the operating conditions of the transistor having the lowest resistance, and when the lowest resistance is shown, the graphene has no bandgap and is in a CNP state and is represented as $D_b = D_t = 0$. In the system of the present invention, $V_{b0}$ and $V_{t0}$ were measured to be $-21.6$ V and $45$ V, respectively.

Figure 8D:
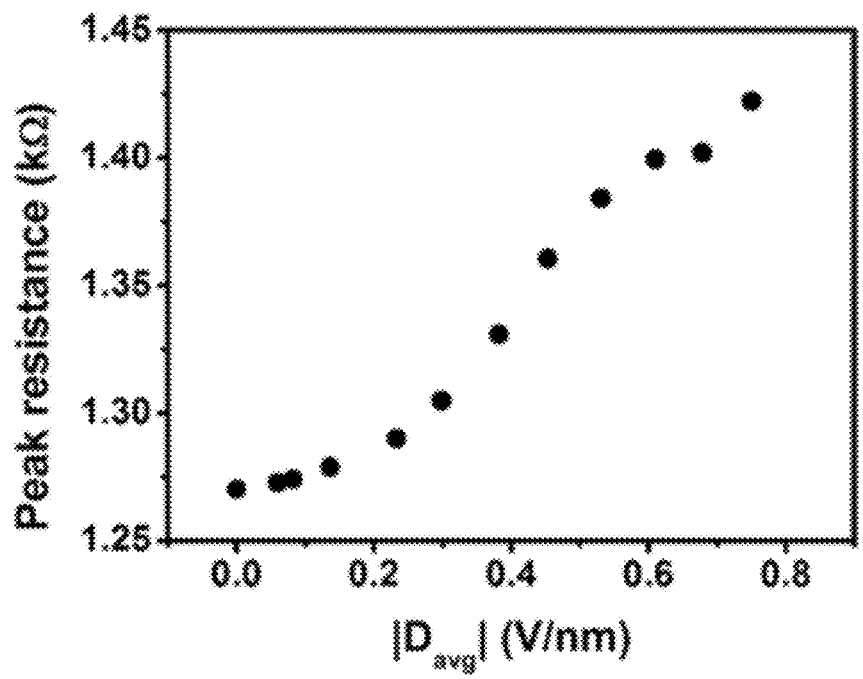
FIG. 8D is a graph showing changes in maximum resistance depending on $D_{avg}$ of the dual-gate graphene transistor device including the multilayer graphene manufactured in Example 1.

With reference to FIG. 8D, the maximum resistance of the transistor gradually increased with an increase in $D_{avg}$. This means that the bandgap of graphene is controllable (the resistance increases with an increase in the bandgap), and the synthesized graphene has a Bernal stacking structure.

Finally, the doping structure of graphene may be understood in more detail based on $V_{b0}$ and $V_{t0}$ obtained through measurement. At $V_b = V_t = 0$, $\delta D$ and $D_{avg}$ were $-0.4$ V/nm and $0.5$ V/nm, respectively. In this case, based on the relationship of $D_b$ and $D_t$ defined above, $\delta D < 0$ and thus the overall graphene system was p-doped, and $D_{avg} > 0$ showed that the upper graphene layer had a higher doping level than the lower layer. Due to this doping level difference in graphene, an electric field is generated in the direction perpendicular to the graphene plane.

In the transistor device structure of the present invention, the lower layer is more p-doped by $SiO_2$, whereas the upper layer is weaker than the original p-doping state by $Al_2O_3$. Therefore, since the doping difference of graphene may be reduced by virtue of the upper and lower dielectric layers, the $D_{avg}$ value of S-graphene is analyzed to be larger upon real-world application.

Consequently, based on the dual-gate transistor measurement of the present invention, it was confirmed that S-graphene was totally hole-doped and had a doping gradient, whereby a vertical electric field was generated in the graphene.

Test Example 6: Analysis of Phosphorus-Doped Multilayer Graphene Structure

Test Example 6-1: Growth of Multilayer Graphene on Copper Catalyst Containing Phosphorus Dissolved Therein FIG. 10 shows the cross-sectional TEM image and electron energy loss spectroscopy (EELS) images of the copper containing phosphorus dissolved therein manufactured in Example 3.

Figure 10:
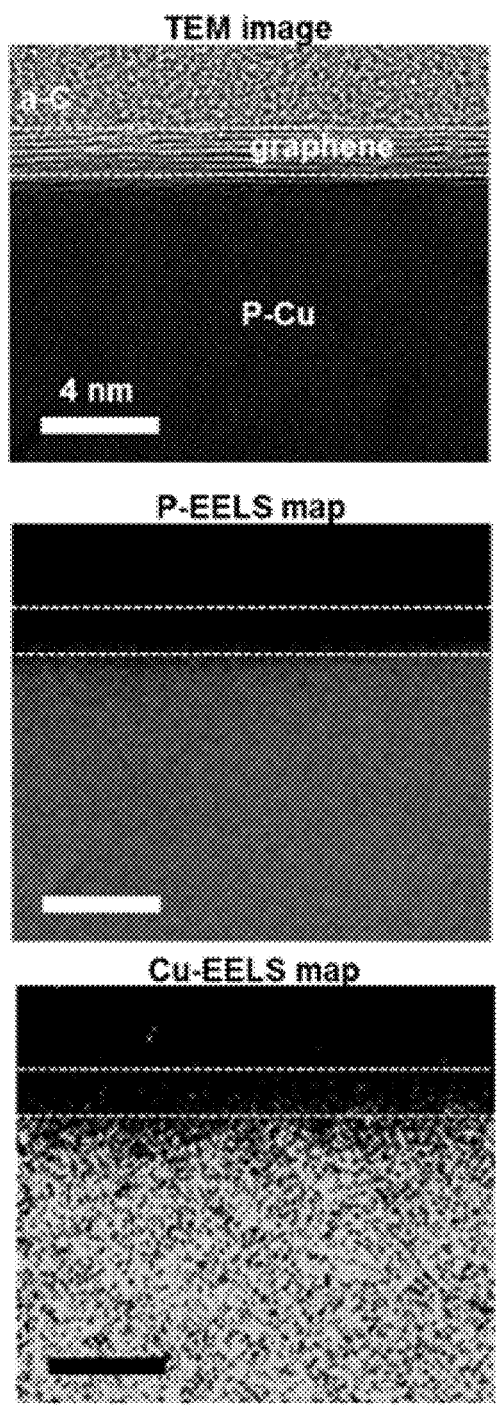
FIG. 10 shows the cross-sectional TEM image, P-EELS map image and Cu-EELS map image of the copper containing phosphorus dissolved therein manufactured in Example 3.

As shown in FIG. 10, the number of layers of multilayer graphene grown on the surface of copper was about 7. Based on the elemental analysis results of the sample through EELS (electron energy loss spectroscopy), phosphorus was uniformly observed in the copper catalyst region, indicating that the multilayer graphene was grown on the copper catalyst containing phosphorus dissolved therein.

Test Example 6-2: Analysis of Quality of Synthesized Graphene

Figure 11:
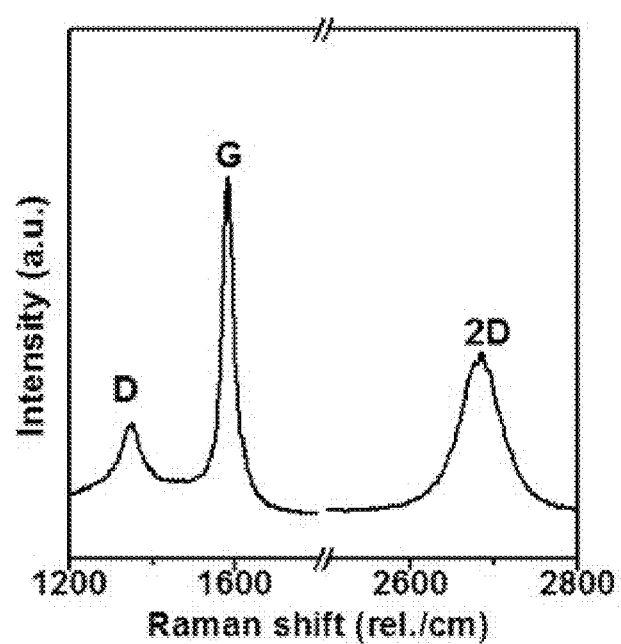
FIG. 11 shows the results of Raman spectroscopy of the multilayer graphene manufactured in Example 3.

FIG. 11 shows the results of Raman spectroscopy of phosphorus-doped multilayer graphene manufactured in Example 3. The graphene synthesized on copper was transferred to a silicon substrate, after which Raman spectroscopy was performed. The synthesis of graphene was confirmed based on the characteristic D, G, and 2D peaks of graphene.

As shown in FIG. 11, the D-to-G peak intensity ratio (ID/IG ratio) of 0.2 resulted in low vacancy density, and when the 2D-to-G peak intensity ratio (I2D/IG ratio) was about 0.5, the characteristics of multilayer graphene appeared, as confirmed by TEM.

Therefore, it was confirmed that high-quality multilayer graphene was grown on the copper catalyst containing phosphorus dissolved therein.

Test Example 6-3: Distribution of Phosphorus in Graphene and Analysis of Concentration Thereof FIG. 12 shows the cross-sectional TEM image of the phosphorus-doped multilayer graphene manufactured in Example 3 and electron energy loss spectroscopy (EELS) images thereof, and FIG. 13 shows the results of analysis of concentration distribution of phosphorus.

Figure 12:
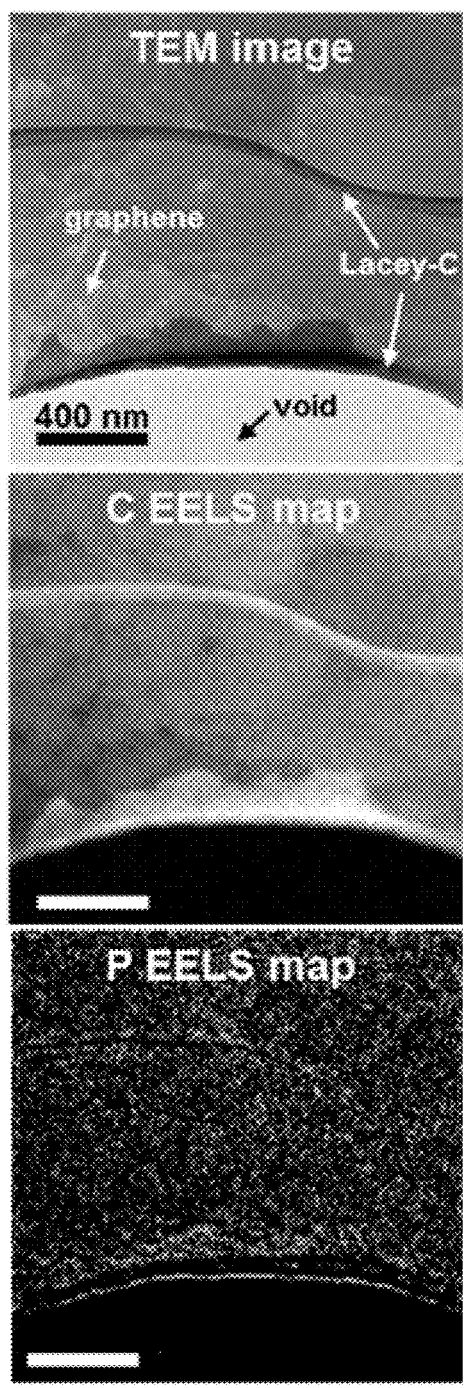
FIG. 12 shows the TEM image, P-EELS map image and Cu-EELS map image of the phosphorus-doped multilayer graphene manufactured in Example 3.
Figure 13:
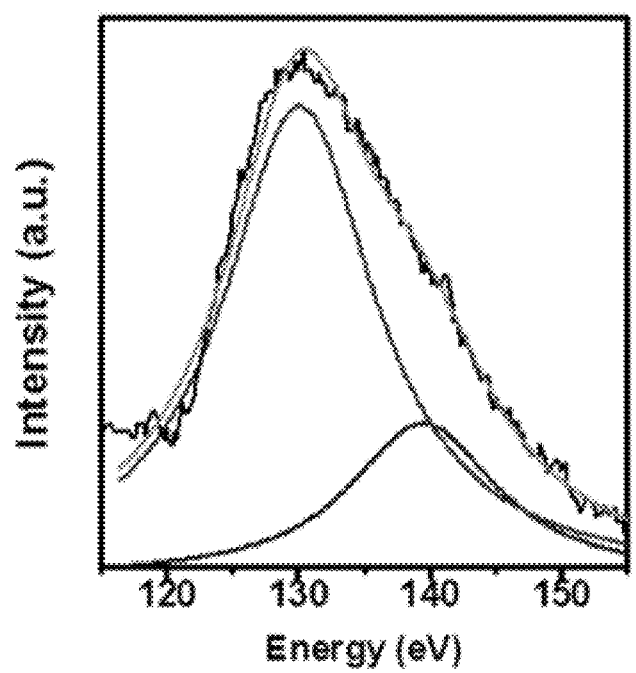
FIG. 13 shows the results of analysis of concentration distribution of phosphorus contained in the multilayer graphene manufactured in Example 3.

As shown in FIGS. 12 and 13, phosphorus (P) was uniformly detected in the synthesized graphene region (carbon detection region), indicating that the synthesized graphene was doped with phosphorus. Under synthesis conditions in which the test of analysis of elemental ratio thereof based on the EELS results for carbon and phosphorus was performed, it was confirmed that a maximum of 7 at % of phosphorus was present in the graphene.

The scope of the invention is represented by the claims below rather than the aforementioned detailed description, and all of the changes or modified forms that are capable of being derived from the meaning, range, and equivalent concepts of the appended claims should be construed as being included in the scope of the present invention.

What is claimed is:

1. A method of manufacturing multilayer graphene, comprising:
    (a) bringing a metal substrate into contact with a nonmetal element, thus forming the nonmetal element adsorbed to a surface of the metal substrate, the nonmetal element dissolved in the surface of the metal substrate and/or a metal compound reacted with the nonmetal element on the surface of the metal substrate;
    (b) heat-treating the nonmetal element adsorbed to the surface of the metal substrate, the nonmetal element dissolved in the surface of the metal substrate and/or the metal compound reacted with the nonmetal element, whereby the nonmetal element adsorbed to the surface of the metal substrate, the nonmetal element dissolved in the surface of the metal substrate and/or the nonmetal element formed by reduction of the metal compound is dissolved into an interior of the metal substrate; and
    (c) subjecting a graphene precursor to chemical vapor deposition on the metal substrate containing the nonmetal element dissolved therein, thereby manufacturing multilayer graphene that is doped with the nonmetal element on the metal substrate.

2. The method of claim 1, wherein the multilayer graphene is Bernal-stacked.

3. The method of claim 1, wherein a number of layers of the multilayer graphene is any one of 1 to 20.

4. The method of claim 1, wherein the nonmetal element is physically adsorbed or chemically bonded to the multilayer graphene.

5. The method of claim 1, wherein the multilayer graphene is configured such that a concentration gradient of the nonmetal element is formed in a thickness direction thereof.

6. The method of claim 1, wherein a concentration gradient of the nonmetal element is formed in a manner in which a concentration of the nonmetal element decreases the closer the multilayer graphene is to the metal substrate.

7. The method of claim 1, wherein a work function and/or a bandgap of the multilayer graphene are adjusted by controlling a concentration gradient of the nonmetal element.

8. The method of claim 1, wherein the nonmetal element includes at least one selected from among sulfur (S), selenium (Se), tellurium (Te), oxygen (O), boron (B), phosphorous (P), and nitrogen (N).

9. The method of claim 1, wherein in step (a), a temperature and/or a time required to bring the metal substrate into contact with the nonmetal element are adjusted, thereby controlling an amount of the nonmetal element adsorbed to the surface of the metal substrate, and/or an amount of the nonmetal element dissolved in the metal substrate, of the metal compound formed on the surface of the metal substrate.

10. The method of claim 1, wherein step (a) is performed at a temperature of 20 to 500° C. for 1 sec to 3600 sec.

11. The method of claim 1, wherein a metal of the metal substrate includes at least one selected from among copper, nickel, zinc, tin, silver, gold, platinum, palladium, iron, cobalt, and alloys thereof.

12. The method of claim 1, wherein the metal compound includes at least one selected from among copper sulfide, silver sulfide, gold sulfide, platinum sulfide, nickel sulfide, zinc sulfide, palladium sulfide, iron sulfide, cobalt sulfide, tin sulfide, copper selenide, silver selenide, gold selenide, platinum selenide, nickel selenide, zinc selenide, palladium selenide, iron selenide, cobalt selenide, tin selenide, copper nitride, silver nitride, zinc nitride, nickel nitride, gold nitride, platinum nitride, palladium nitride, iron nitride, cobalt nitride, tin nitride, copper phosphide, nickel phosphide, zinc phosphide, palladium phosphide, silver phosphide, gold phosphide, platinum phosphide, iron phosphide, cobalt phosphide, tin phosphide, copper telluride, silver telluride, gold telluride, platinum telluride, nickel telluride, zinc telluride, palladium telluride, iron telluride, cobalt telluride, tin telluride, copper boride, silver boride, gold boride, platinum boride, nickel boride, zinc boride, palladium boride, iron boride, cobalt boride, tin boride, and nitrides, phosphides, sulfides, selenides, tellurides and borides of metal alloys.

13. The method of claim 1, wherein in step (b), reduction is carried out through heat treatment.

14. The method of claim 13, wherein the heat treatment is performed at a temperature of 500 to 2,000° C.

15. The method of claim 1, wherein in step (c), the nonmetal element dissolved into the interior of the metal substrate is physically adsorbed or chemically bonded to the multilayer graphene and thus multilayer graphene, which is doped with the nonmetal element and is Bernal-stacked, is formed.

16. The method of claim 1, wherein the graphene precursor is a hydrocarbon compound.

17. The method of claim 16, wherein the hydrocarbon compound includes at least one selected from the group consisting of methane, ethane, propane, butane, ethylene, propylene, butylene, benzene, ethanol, methanol, isopropyl alcohol, 1,2,3,4-tetraphenylnaphthalene (TPN), anthracene, pyrene, naphthalene, fluoranthene, hexaphenylbenzene, tetraphenylcyclopentadienone, diphenylacetylene, phenylacetylene, triptycene, tetracene, chrysene, triphenylene, coronene, pentacene, corannulene, and ovalene.

18. The method of claim 1, wherein the chemical vapor deposition is performed at a temperature of 600 to 1,200° C.

19. The method of claim 1, wherein the chemical vapor deposition is performed through any one process selected from the group consisting of low-pressure chemical vapor deposition, atmospheric-pressure chemical vapor deposition, plasma-enhanced chemical vapor deposition, Joule-heating chemical vapor deposition, and microwave chemical vapor deposition.

20. A multilayer graphene, manufactured by the method of claim 1.

* * * * *